United States Patent
Choi et al.

(10) Patent No.: US 9,887,332 B2
(45) Date of Patent: Feb. 6, 2018

(54) SEMICONDUCTOR LIGHT-EMITTING DEVICE PACKAGE

(71) Applicant: SAMSUNG ELECTRONICS CO., LTD., Suwon-si (KR)

(72) Inventors: Pun Jae Choi, Yongin-si (KR); Geun Woo Ko, Suwon-si (KR); Yong Min Kwon, Seoul (KR); Ah Young Woo, Seoul (KR); Jun Ho Lee, Seoul (KR); Jin Wook Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/056,117

(22) Filed: Feb. 29, 2016

(65) Prior Publication Data

US 2016/0351767 A1 Dec. 1, 2016

(30) Foreign Application Priority Data

May 29, 2015 (KR) .......................... 10-2015-0076571

(51) Int. Cl.
*H01L 33/62* (2010.01)
*H01L 25/16* (2006.01)
(Continued)

(52) U.S. Cl.
CPC .......... *H01L 33/62* (2013.01); *H01L 25/0753* (2013.01); *H01L 25/167* (2013.01);
(Continued)

(58) Field of Classification Search
CPC ....... H01L 33/62; H01L 33/486; H01L 33/56; H01L 33/50; H01L 33/52; H01L 33/22;
(Continued)

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| JP | 2011-187957 A | 9/2011 |
| JP | 2012-212871 A | 11/2012 |

(Continued)

OTHER PUBLICATIONS

Mangroli et al. Optimizing thermal and mechanical performance in PCBs, Global SMt NS. packaging, 2007, pp. 10-12.*

(Continued)

*Primary Examiner* — Galina Yushina
(74) *Attorney, Agent, or Firm* — Sughrue Mion, PLLC

(57) ABSTRACT

A semiconductor light-emitting device package includes: a light-emitting structure having a first surface, a second surface opposite to the first surface and side surfaces disposed between the first and the second surfaces, the light-emitting structure comprising a first light-emitting laminate and a second light-emitting laminate, each of the first and the second light emitting laminates including: a first conductivity-type semiconductor layer; an active layer, and a second conductivity-type semiconductor layer, an interconnector provided on the second surface of the light-emitting structure and configured to electrically connect the first and the second light-emitting laminates; a metal guide surrounding the side surfaces of the light-emitting structure; and an encapsulant surrounding the metal guide and the second and the side surfaces of the light-emitting structure and exposing the first surface of the light-emitting structure.

16 Claims, 28 Drawing Sheets

(51) Int. Cl.
*H01L 25/075* (2006.01)
*H01L 33/48* (2010.01)
*H01L 33/56* (2010.01)
*H01L 33/60* (2010.01)

(52) U.S. Cl.
CPC ............ *H01L 33/486* (2013.01); *H01L 33/56* (2013.01); *H01L 33/60* (2013.01)

(58) Field of Classification Search
CPC ... H01L 33/38; H01L 25/0753; H01L 25/167; H01L 27/00; H01L 27/3204
See application file for complete search history.

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2008/0048203 A1* | 2/2008 | Son | H01L 33/486 257/98 |
| 2010/0059763 A1 | 3/2010 | Kim et al. | |
| 2011/0215350 A1 | 9/2011 | Song et al. | |
| 2011/0260275 A1 | 10/2011 | Cho | |
| 2012/0241792 A1 | 9/2012 | Obata et al. | |
| 2013/0082293 A1* | 4/2013 | Yang | H01L 33/54 257/98 |
| 2013/0140598 A1* | 6/2013 | Hoppel | H01L 33/382 257/98 |
| 2014/0084182 A1 | 3/2014 | Kim et al. | |
| 2014/0175471 A1* | 6/2014 | Akimoto | H01L 27/156 257/91 |
| 2014/0209958 A1 | 7/2014 | Park et al. | |
| 2015/0104890 A1* | 4/2015 | Kim | H01L 33/62 438/26 |

FOREIGN PATENT DOCUMENTS

| | | |
|---|---|---|
| JP | 2013-038212 A | 2/2013 |
| KR | 10-2014-0039740 A | 4/2014 |
| KR | 10-2014-0097898 A | 8/2014 |
| KR | 10-2014-0121608 A | 10/2014 |
| KR | 10-2015-0029996 A | 3/2015 |

OTHER PUBLICATIONS

Chapter 17 material expansion coefficients, user's manufal, pp. 17-2-17-12, 2002.*

* cited by examiner

SEMICONDUCTOR LIGHT-EMITTING DEVICE PACKAGE

CROSS-REFERENCE TO RELATED APPLICATION

This application claims the priority from Korean Patent Application No. 10-2015-0076571 filed on May 29, 2015, in the Korean Intellectual Property Office, the disclosure of which is incorporated herein by reference in its entirety.

BACKGROUND

Apparatuses consistent with example embodiments relate to a semiconductor light-emitting device package.

Semiconductor light-emitting devices are light sources emitting light through electron-hole recombination, and are seeing widespread use in various fields due to a number of advantages thereof, such as low power consumption, high luminance levels, compactness, and the like.

Semiconductor light-emitting device packages may be fabricated using a semiconductor layer and several other materials having different physical properties from the semiconductor layer. Here, reliability of the semiconductor light-emitting device packages may be degraded due to the difference in physical properties between the semiconductor layer and the other package structures.

Accordingly, methods of improving reliability of semiconductor light-emitting device packages are required.

SUMMARY

One or more example embodiments may provide a semiconductor light-emitting device package having improved reliability.

According to an aspect of an example embodiment, there is provided a semiconductor light-emitting device package including a light-emitting structure including a plurality of light-emitting laminates in which a first conductivity-type semiconductor layer, an active layer, and a second conductivity-type semiconductor layer are sequentially stacked, and having first and second surfaces opposing each other and side surfaces disposed therebetween, an interconnector disposed on the second surface of the light-emitting structure and electrically connecting the plurality of light-emitting laminates, an encapsulant disposed to surround the second surface and the side surfaces of the light-emitting structure and exposing the first surface of the light-emitting structure, and a metal guide encapsulated by the encapsulant and disposed to surround the side surfaces of the light-emitting structure.

The metal guide may be spaced apart from the light-emitting structure.

The interconnector may be spaced apart from the metal guide.

At least a portion of the interconnector may be connected to the metal guide.

The plurality of light-emitting laminates may be arranged in a first direction, and the interconnector may extend from one side to the other side of the metal guide between adjacent light-emitting laminates in a second direction substantially perpendicular to the first direction.

The plurality of light-emitting laminates may further include first and second electrode structures respectively connected to the first and second conductivity-type semiconductor layers.

The first electrode structure may include a first contact disposed in a contact hole passing through the second conductivity-type semiconductor layer and the active layer and exposing a portion of the first conductivity-type semiconductor layer while being in contact with the first conductivity-type semiconductor layer, and a first connector connected to the first contact, and the second electrode structure may include a second contact in contact with the second conductivity-type semiconductor layer and a second connector connected to the second contact.

The semiconductor light-emitting device package may further include a first pad disposed on the first electrode structure of one of the plurality of light-emitting laminates, a second pad disposed on the second electrode structure of another of the plurality of light-emitting laminates, and first and second metal posts connected to the first and second pads and having portions exposed from the encapsulant so as to be connected to an external power source.

The metal guide may be connected to at least one of the first and second pads.

The interconnector may connect the first conductivity-type semiconductor layer of one of adjacent light-emitting laminates to the second conductivity-type semiconductor layer of another of the adjacent light-emitting laminates.

The interconnector and the metal guide may be formed of the same material.

A coefficient of thermal expansion of the metal guide may be greater than a coefficient of thermal expansion of the plurality of light-emitting laminates, and lower than a coefficient of thermal expansion of the encapsulant.

According to an aspect of another example embodiment, there is provided a semiconductor light-emitting device package including a light-emitting laminate in which a first conductivity-type semiconductor layer, an active layer, and a second conductivity-type semiconductor layer are sequentially stacked and having first and second surfaces provided by the first and second conductivity-type semiconductor layers and side surfaces disposed therebetween, a first electrode structure formed on the second surface of the light-emitting laminate, disposed in a contact hole passing through the second conductivity-type semiconductor layer and the active layer to expose a portion of the first conductivity-type semiconductor layer, while being in contact with the first conductivity-type semiconductor layer, a second electrode structure disposed on the second conductivity-type semiconductor layer, a metal guide spaced apart from the light-emitting laminate and surrounding the side surfaces of the light-emitting laminate, an encapsulant encapsulating the metal guide, surrounding the second surface and the side surfaces of the light-emitting laminate, and exposing the first surface of the light-emitting laminate, and first and second metal posts respectively connected to the first and second pads of the light-emitting laminate and having portions exposed from the encapsulant so as to be electrically connected to an external power source.

The metal guide may be formed of the same material as the first and second pads.

A hardness of the metal guide may be greater than a hardness of the first and second posts.

According to an aspect of another example embodiment, there is provided a semiconductor light-emitting device package including a light-emitting structure having a plurality of light-emitting laminates in which a first conductivity-type semiconductor layer, an active layer, and a second conductivity-type semiconductor layer are sequentially stacked, an interconnector configured to electrically connect adjacent light-emitting laminates among the plurality of light-emitting laminates in series, a first metal guide disposed to surround a portion of the light-emitting structure and electrically connected to the first conductivity-type semiconductor layer of one of the plurality of light-emitting laminates, and a second metal guide electrically separated from the first metal guide, disposed to surround another portion of the light-emitting structure, and electrically connected to the second conductivity-type semiconductor layer of another one of the plurality of light-emitting laminates, and an encapsulant encapsulating the light-emitting structure and exposing a surface of the light-emitting structure. A portion of the first and second metal guides may be exposed from the encapsulant to be electrically connected to an external power source.

According to an aspect of another example embodiment, there is provided a semiconductor light-emitting device package, including: a light-emitting structure having a first surface, a second surface opposite to the first surface and side surfaces disposed between the first and the second surfaces, the light-emitting structure including a first light-emitting laminate and a second light-emitting laminate, each of the first and the second light emitting laminates including: a first conductivity-type semiconductor layer; an active layer, and a second conductivity-type semiconductor layer, the first conductivity-type semiconductor layer, the active layer and the second conductivity-type semiconductor layer being sequentially stacked in a direction from the first surface to the second surface, an interconnector provided on the second surface of the light-emitting structure and configured to electrically connect the first and the second light-emitting laminates; a metal guide surrounding the side surfaces of the light-emitting structure; and an encapsulant surrounding the metal guide and the second and the side surfaces of the light-emitting structure and exposing the first surface of the light-emitting structure.

The encapsulant may be provided between the metal guide and the light-emitting structure.

The encapsulant may be provided between the interconnector and the metal guide.

At least a portion of the interconnector may be connected to the metal guide.

The first and the second light-emitting laminates may be arranged in a first direction, and wherein the interconnector extends from a first side to a second side opposite to the first side of the metal guide between adjacent light-emitting laminates in a second direction substantially perpendicular to the first direction.

Each of the first and the second light-emitting laminates may further include: a first electrode structure connected to the first conductivity-type semiconductor layer; and a second electrode structure connected to the second conductivity-type semiconductor layer.

The first electrode structure may include: a first contact disposed in a contact hole passing through the second conductivity-type semiconductor layer and the active layer and exposing a portion of the first conductivity-type semiconductor layer while being in contact with the first conductivity-type semiconductor layer; and a first connector connected to the first contact, and wherein the second electrode structure includes: a second contact in contact with the second conductivity-type semiconductor layer; and a second connector connected to the second contact.

A first pad may be provided on the first electrode structure of the first light-emitting laminate; a second pad may be provided on the second electrode structure of the second light-emitting laminate; and first and second metal posts may be connected to the first and second pads, respectively, the first and second metal posts having portions exposed from the encapsulant so as to be connected to an external power source.

The metal guide may be connected to at least one of the first and second pads.

The interconnector may connect the first conductivity-type semiconductor layer of the first light-emitting laminate to the second conductivity-type semiconductor layer of the second light-emitting laminate.

The interconnector and the metal guide may be formed of the same material.

A coefficient of thermal expansion of the metal guide may be greater than a coefficient of thermal expansion of the first and the second light-emitting laminates, and lower than a coefficient of thermal expansion of the encapsulant.

The semiconductor light-emitting device package may further include a transparent resin layer containing phosphor on the first and the second light-emitting laminates.

The first conductivity-type semiconductor layer may include embossings formed on an upper surface thereof.

According to an aspect of another example embodiment, there is provided a semiconductor light-emitting device package, including: a light-emitting laminate having a first surface, a second surface opposite to the first surface and side surfaces disposed between the first and the second surfaces, the light-emitting structure and including: a first conductivity-type semiconductor layer; an active layer; and a second conductivity-type semiconductor layer, the first conductivity-type semiconductor layer, the active layer and the second conductivity-type semiconductor layer being sequentially stacked in a direction from the first surface to the second surface; a first electrode structure formed on the second surface of the light-emitting laminate, disposed in a contact hole passing through the second conductivity-type semiconductor layer and the active layer to expose a portion of the first conductivity-type semiconductor layer, the first electrode structure being in contact with the first conductivity-type semiconductor layer; a second electrode structure disposed on the second conductivity-type semiconductor layer; a metal guide spaced apart from the light-emitting laminate and surrounding the side surfaces of the light-emitting laminate; an encapsulant encapsulating the metal guide, surrounding the second surface and the side surfaces of the light-emitting laminate, and exposing the first surface of the light-emitting laminate; and first and second metal posts respectively connected to the first and second electrode structures of the light-emitting laminate and having portions exposed from the encapsulant so as to be electrically connected to an external power source.

The encapsulant may be provided between the metal guide and the light-emitting laminate.

The metal guide may be formed in a loop to surround the side surfaces of the light-emitting laminate.

According to an aspect of another example embodiment, there is provided a semiconductor light-emitting device package, including: a light-emitting structure having a first surface, a second surface opposite to the first surface and side surfaces disposed between the first and the second surfaces, the light-emitting structure including a first light-emitting laminate and a second light-emitting laminate, each of the first and the second light emitting laminates including: a first conductivity-type semiconductor layer; an active layer, and a second conductivity-type semiconductor layer, the first conductivity-type semiconductor layer, the active layer and the second conductivity-type semiconductor layer being sequentially stacked in a direction from the first surface to the second surface, an interconnector provided on the second surface of the light-emitting structure and configured to electrically connect the first and the second light-emitting laminates; a first metal guide surrounding first, second and third surfaces of the side surfaces of the first light-emitting laminate; and a second metal guide surrounding first, second and third surfaces of the side surfaces of the second light-emitting laminate; and an encapsulant surrounding the first and the second metal guides and the second and the side surfaces of the light-emitting structure and exposing the first surface of the light-emitting structure.

The semiconductor light-emitting device package may further include: a first pad provided on the first light-emitting laminate; a second pad provided on the second light-emitting laminate, and wherein the first metal guide is connected to the first pad and the second metal guide is connected to the second pad.

The first and the second metal guides may be connected to an external power source.

BRIEF DESCRIPTION OF DRAWINGS

The above and/or other aspects, features and advantages of the present inventive concept will be more clearly understood from the following detailed description taken in conjunction with the accompanying drawings, in which.

DETAILED DESCRIPTION

Figure 1A:
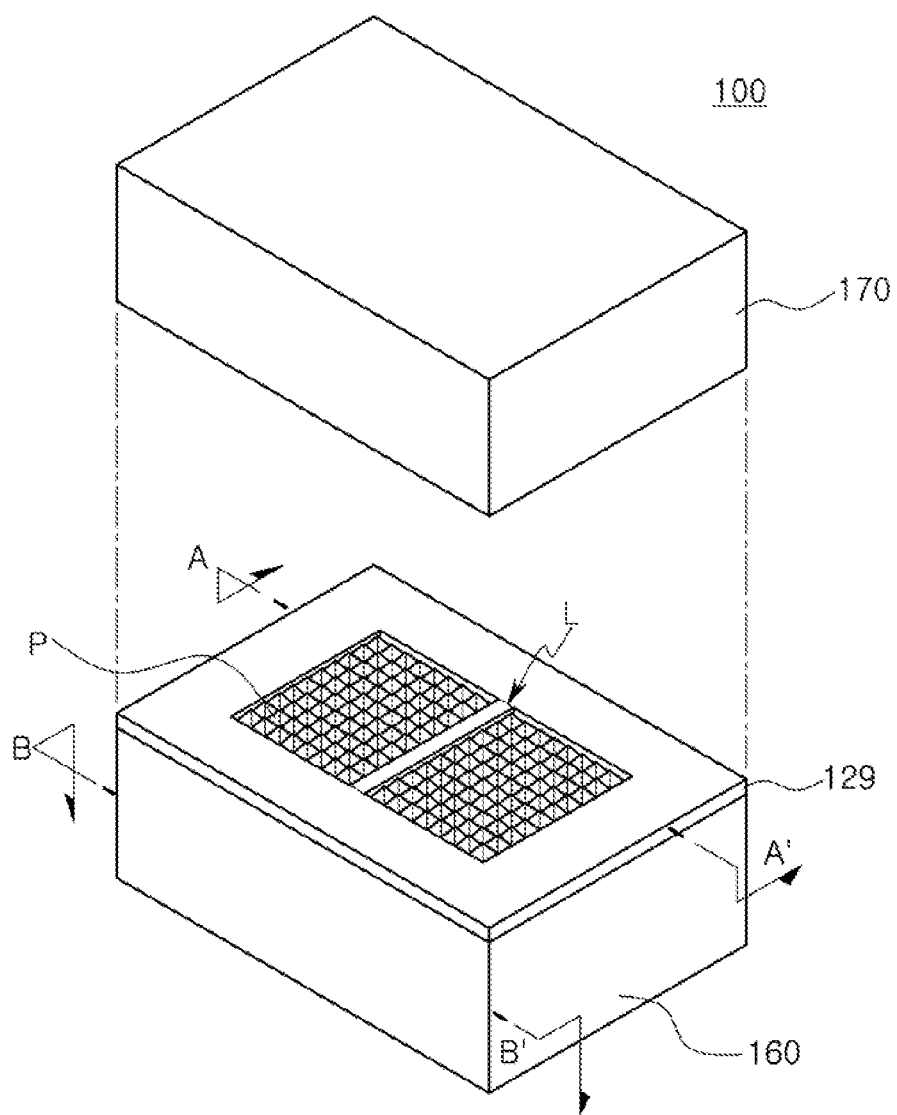
FIG. 1A is an exploded perspective view of a semiconductor light-emitting device package according to an example embodiment.

Hereinafter, example embodiments of the present inventive concept will be described in detail with reference to the accompanying drawings.

The inventive concept may, however, be exemplified in many different forms and should not be construed as being limited to the specific embodiments set forth herein. Example embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes each and all combinations of at least one of the referred items.

It will be understood that, although the terms first, second, etc. are used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present inventive concept.

Figure 1B:
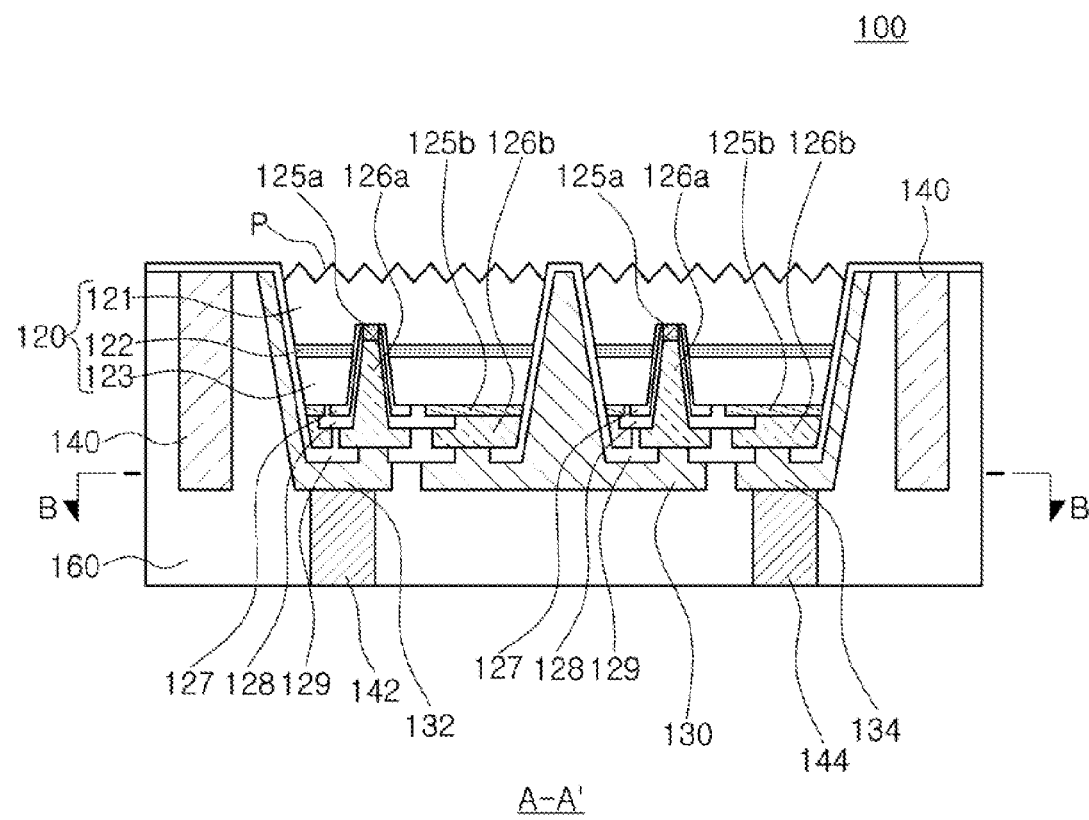
FIG. 1B is a cross-sectional view taken along line A-A' of the semiconductor light-emitting device package illustrated in FIG. 1A.
Figure 1C:
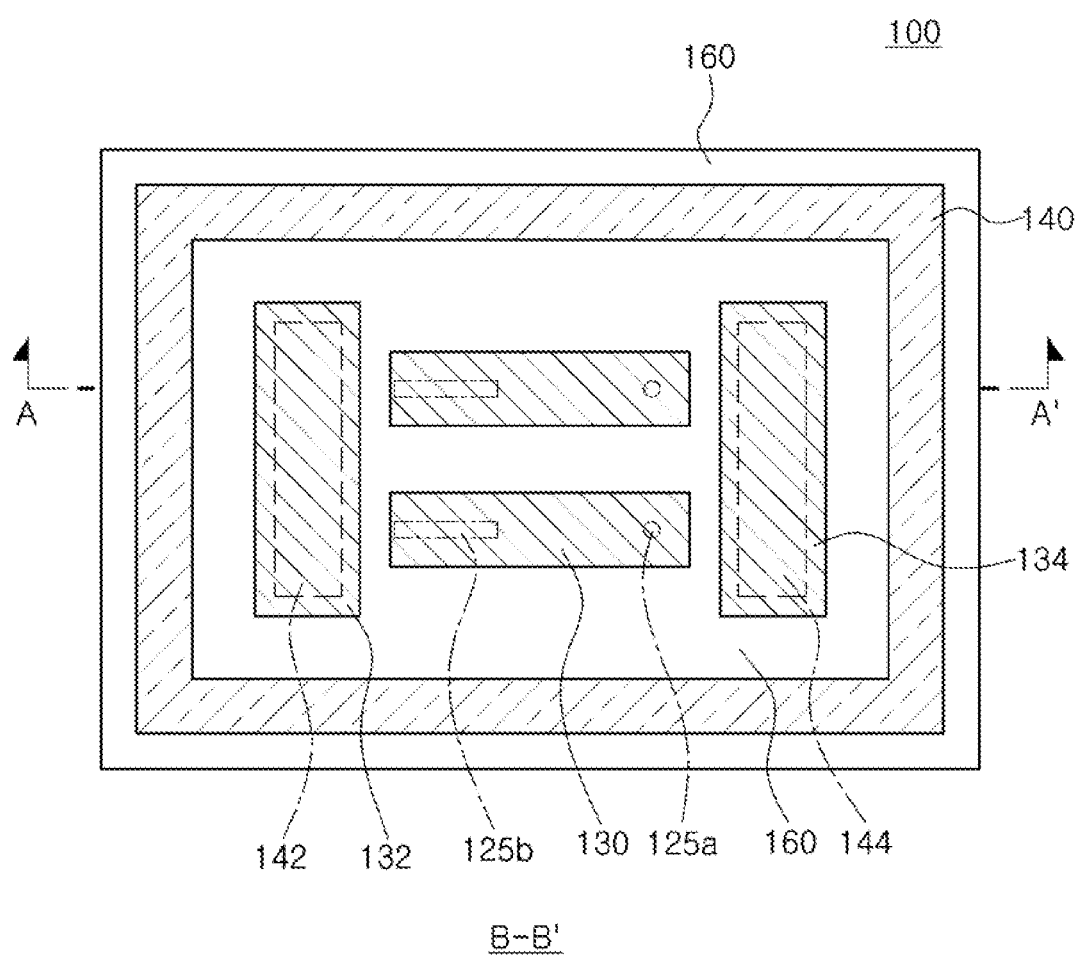
FIG. 1C is a cross-sectional view taken along line B-B' of the semiconductor light-emitting device package illustrated in FIG. 1A.

FIG. 1A is an exploded perspective view of a semiconductor light-emitting device package 100 according to an example embodiment, FIG. 1B is a cross-sectional view taken along line A-A' of the semiconductor light-emitting device package 100 illustrated in FIG. 1A, and FIG. 1C is a cross-sectional view taken along line B-B' of the semiconductor light-emitting device package 100 illustrated in FIG. 1A.

Referring to FIGS. 1A to 1C, a semiconductor light-emitting device package 100 may include a light-emitting structure L having two light-emitting laminates 120, an interconnector 130 electrically connecting the two light-emitting laminates 120, a metal guide 140 surrounding a side of the light-emitting structure L, and an encapsulant 160 encapsulating the metal guide 140 and the light-emitting structure L.

In FIGS. 1A to 1C, two light-emitting laminates 120 are connected in series, but the example embodiment is not limited thereto. For example, two or more light-emitting laminates 120 may be connected in series or in parallel.

Each of the light-emitting laminates 120 may include a first conductivity-type semiconductor layer 121, an active layer 122, and a second conductivity-type semiconductor layer 123, sequentially stacked.

The first conductivity-type semiconductor layer 121 may be a nitride semiconductor layer satisfying n-type $In_xAl_yGa_{1-x-y}N$ ($0 \leq x < 1$, $0 \leq y < 1$, and $0 \leq x+y < 1$), and n-type impurities may be silicon (Si). For example, the first conductivity-type semiconductor layer 121 may include n-type GaN.

The first conductivity-type semiconductor layer 121 may include a first conductivity-type semiconductor contact layer and a current spreading layer. Impurity concentrations of the first conductivity-type semiconductor contact layer may be in the range of $2 \times 10^{18}$ cm$^{-3}$ to $9 \times 10^{19}$ cm$^{-3}$. A thickness of the first conductivity-type semiconductor contact layer may be in the range of 1 μm to 5 μm. The current spreading layer may have a laminate structure in which a plurality of $In_xAl_yGa_{(1-x-y)}N$ ($0 \leq x$, $y \leq 1$, and $0 \leq x+y \leq 1$) layers having different compositions or impurity concentrations are repeatedly stacked. For example, the current spreading layer may be an n-type GaN layer having a thickness of 1 nm to 500 nm and/or an n-type super lattice layer in which two or more $Al_xIn_yGa_zN$ ($0 \leq x,y,z \leq 1$, and $x+y+z \neq 0$) layers having different compositions are repeatedly stacked. The impurity concentration of the current spreading layer may be in the range of $2 \times 10^{18}$ cm$^{-3}$ to $9 \times 10^{19}$ cm$^{-3}$. As necessary, the current diffusion layer may further include an insulating material layer.

The active layer 122 may have a multiple quantum well (MQW) structure in which quantum well layers and quantum barrier layers are alternately stacked. For example, the quantum well layers and the quantum barrier layers may be $In_xAl_yGa_{1-x-y}N$ ($0 \leq x \leq 1$, $0 \leq y \leq 1$, and $0 \leq x+y \leq 1$) layers having different compositions. For example, the quantum well layers may be $In_xGa_{1-x}N$ ($0 < x \leq 1$), and the quantum barrier layers may be GaN or AlGaN. Each of the quantum well layers and the quantum barrier layers may have a thickness of 1 nm to 50 nm. The active layer 122 may not be limited to the MQW structure, and may have a single quantum well (SQW) structure.

The second conductivity-type semiconductor layer 123 may be a nitride semiconductor layer satisfying p-type $In_xAl_yGa_{1-x-y}N$ ($0 \leq x < 1$, $0 \leq y < 1$, and $0 \leq x+y < 1$), and p-type impurities may be magnesium (Mg).

The second conductivity-type semiconductor layer 123 may include an electron-blocking layer, a low-concentration p-type GaN layer, and a high-concentration p-type GaN layer provided as a contact layer. For example, the electron-blocking layer may be a multilayer structure in which a plurality of $In_xAl_yGa_{(1-x-y)}N$ ($0 \leq x \leq 1$, $0 \leq y \leq 1$, and $0 \leq x+y \leq 1$) layers having different compositions and having a thickness of 5 nm to 100 nm are stacked, or a single layer consisting of $Al_yGa_{(1-y)}N$ ($0 < y \leq 1$). An energy band gap of the electron-blocking layer may decrease as a distance from the active layer 122 increases. For example, an Al composition of the electron-blocking layer may decrease as a distance from the active layer 122 increases.

Embossings P may be formed on an upper surface of the first conductivity-type semiconductor layer 121. Due to the embossings P, diffused reflection of light emitted from the light-emitting laminates 120 may increase and therefore light extraction efficiency of the semiconductor light-emitting device package 100 may increase.

As described above, the light-emitting structure L may include two light-emitting laminates 120, and may have a first surface provided as a surface of the first conductivity-type semiconductor layer 121, a second surface disposed to oppose the first surface and provided as a surface of the second conductivity-type semiconductor layer 123, and side surfaces disposed therebetween.

Each of the plurality of light-emitting laminates may further include first and second electrode structures respectively connected to the first and second conductivity-type semiconductor layers 121 and 123. In the example embodiment, the first and second electrode structures may include first and second contacts 125a and 125b and first and second interconnection members 126a and 126b, respectively.

Referring to FIG. 1B, a contact hole passing through the second conductivity-type semiconductor layer 123 and the active layer 122 to expose the first conductivity-type semiconductor layer 121 may be formed. A first insulating layer 127 may be formed on a sidewall of the contact hole and a portion of the second conductivity-type semiconductor layer 123. The first contact 125a in contact with the exposed first conductivity-type semiconductor layer 121 may be disposed in the contact hole. In addition, the second contact 125b may be disposed on a portion of a lower surface of the second conductivity-type semiconductor layer 123 to be electrically connected to the second conductivity-type semiconductor layer 123. In order to electrically isolate the first contact 125a from the second contact 125b, a second insulating layer 128 may be disposed between the first contact 125a and the second contact 125b. The first and second contacts 125a and 125b may be reflective electrodes including at least one of Ag, Al, Ni, Cr, Cu, Au, Pd, Pt, Sn, W, Rh, Jr, Ru, Mg, Zn, and an alloy material thereof.

The first interconnection member 126a filling the contact hole may be electrically connected to the first contact 125a. The second interconnection member 126b may be disposed on a lower surface of the second contact 125b to be electrically connected to the second contact 125b. A third insulating layer 129 may be disposed between the first interconnection member 126a and the second interconnection member 126b to electrically isolate the first interconnection member 126a from the second interconnection member 126b.

The interconnector 130 electrically connecting the light-emitting laminates 120 may be disposed on the second surface of the light-emitting structure L. According to the example embodiment, the interconnector 130 may connect the first interconnection member 126a of one of the light-emitting laminates 120 to the second interconnection member 126b of the other of the light-emitting laminates 120, and thereby electrically connect the light-emitting laminates 120. The third insulating layer 129 may isolate the interconnector 130 from side surfaces of the light-emitting laminates 120. The light-emitting laminates 120 adjacent to each other may be electrically connected in series by the interconnector 130. Although serial connection is described in the example embodiment, the light-emitting laminates 120 may be connected in parallel by connecting the same conductivity-type semiconductor layers, as necessary. When single semiconductor light-emitting device packages are connected in series, a design of a lighting apparatus may not be freely configurable, due to a component, such as a lead frame, forming the semiconductor light-emitting device package. When the light-emitting laminates 120 are connected in series at wafer level, luminous flux may be increased to a high level by applying a high voltage to the light-emitting laminates 120, and the lighting apparatus may be easily provided with a preferred design.

In the light-emitting laminates 120, the first and second interconnection members 126a and 126b, which are not connected to the interconnector 130, may be electrically connected to first and second pads 132 and 134, respectively. The first pad 132 may electrically connect the first interconnection member 126a, not connected to the interconnector 130, to a first metal post 142. In addition, the second pad 134 may electrically connect the second interconnection member 126b, not connected to the interconnector 130, to a second metal post 144.

The first pad 132 and the first metal post 142 may be sequentially disposed below the first interconnection member 126a, not connected to the interconnector 130. In addition, the second pad 134 and the second metal post 144 may be sequentially disposed below the second interconnection member 126b, not connected to the interconnector 130.

The metal guide 140 may be disposed to be spaced apart from the light-emitting structure L. The metal guide 140 may surround the side of the light-emitting structure L in the form of a closed loop. In addition, the metal guide 140 may be disposed to be spaced apart from the interconnector 130. When the metal guide 140 and the interconnector 130 are formed at the same time, the metal guide 140 and the interconnector 130 may be formed of the same material.

The encapsulant 160 may encapsulate the metal guide 140 and the light-emitting structure L while exposing a light-emitting surface (that is, the first surface) of the light-emitting structure L and lower surfaces of the first and second metal posts 142 and 144 on which the first and second metal posts 142 and 144 are connected to an external power source. The encapsulant 160 may be formed of a resin having a high Young's modulus so as to support the light-emitting laminates 120. The encapsulant 160 may be, for example, epoxy resin or silicone resin. The encapsulant 160 may have a high thermal conductivity to dissipate heat generated in the light-emitting laminates 120. The encapsulant 160 may include a light-reflecting material so as to reflect light emitted from the side surfaces of the light-emitting laminates 120. The light-reflecting material may be, for example, titanium dioxide ($TiO_2$) or aluminum oxide ($Al_2O_3$).

A coefficient of thermal expansion of the metal guide 140 may be greater than a coefficient of thermal expansion of the light-emitting laminates 120, and lower than a coefficient of thermal expansion of the encapsulant 160. When the coefficient of thermal expansion of the light-emitting laminates 120 is lower than that of the encapsulant 160, cracks may occur in the light-emitting laminates 120 due to tensile stresses applied to the light-emitting laminates 120. The cracks may increase as the number of the light-emitting laminates 120 connected in series increases. Because the metal guide 140 has the thermal coefficient in the range between that of the light-emitting laminates 120 and that of the encapsulant 160 and is embedded between the light-emitting laminates 120 and the encapsulant 160, cracking of the light-emitting laminates 120 may be prevented.

A transparent resin layer 170 including a phosphor may be disposed on the light-emitting structure L. A wavelength of light emitted from the light-emitting structure L may be changed by phosphor particles. Accordingly, the semiconductor light-emitting device package 100 emitting light having a variety of colors may be designed.

Figure 2:
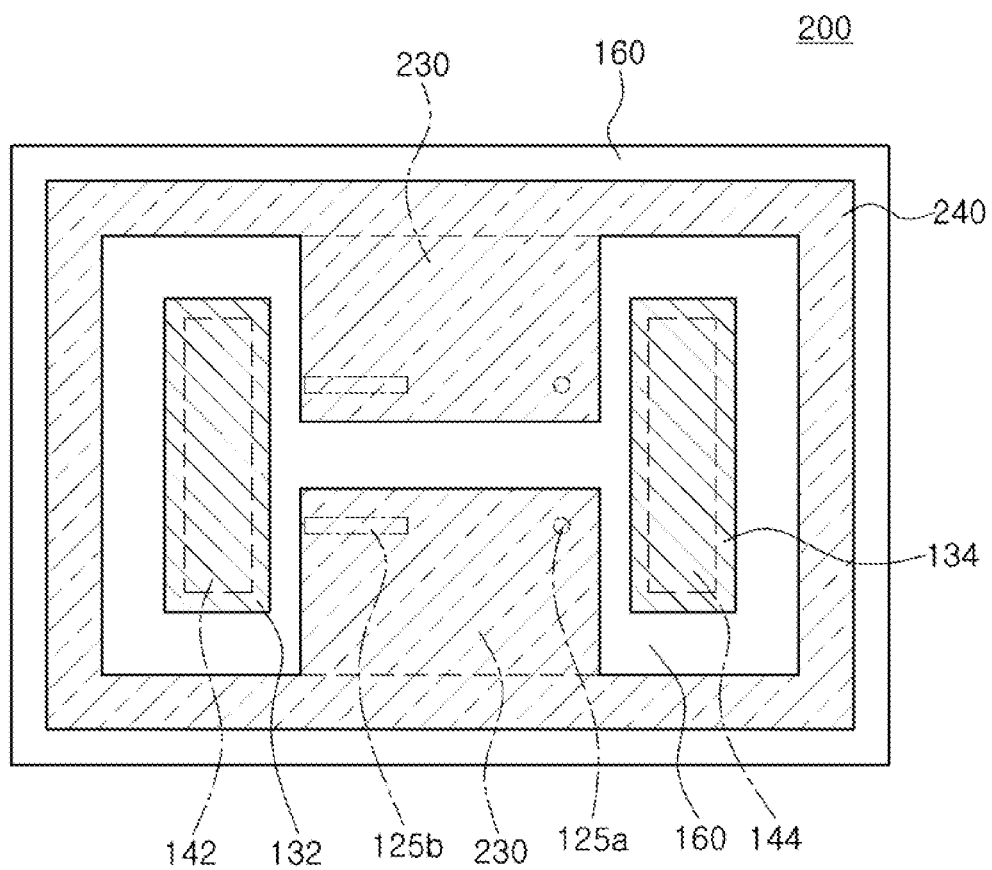
FIGS. 2 to 5B are cross-sectional views of semiconductor light-emitting device packages according to an example embodiment.

FIG. 2 is a cross-sectional view of a semiconductor light-emitting device package 200 according to an example embodiment. FIG. 2 is a view of the same area as the cross-section taken along line B-B' of the semiconductor light-emitting device package 100 illustrated in FIGS. 1A to 1C.

Referring to FIG. 2, a metal guide 240 may surround the light-emitting structure L (please refer to FIG. 1A) in the form of a closed loop. An interconnector 230 may be connected to the metal guide 240. In addition, the interconnector 230 may be disposed between the light-emitting laminates 120 (please refer to FIG. 1B) and may electrically connect the light-emitting laminates 120 (please refer to FIG. 1B) in series.

Figure 3:
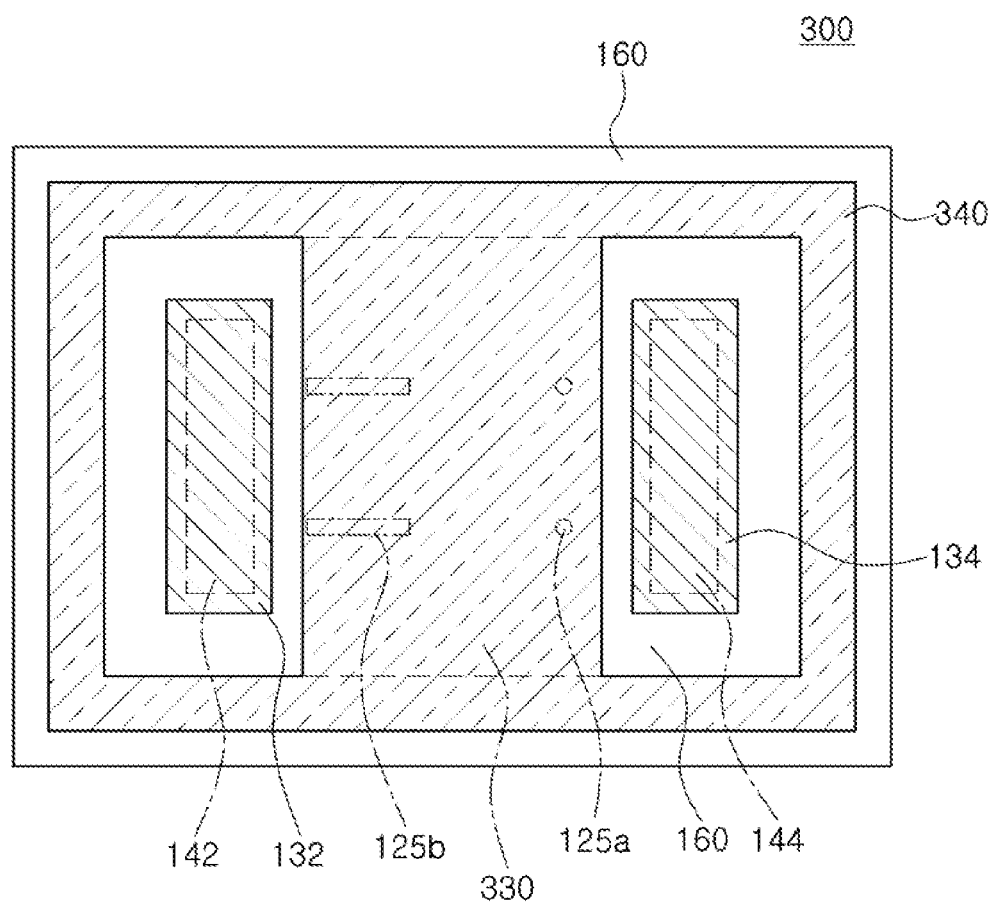

FIG. 3 is a cross-sectional view of a semiconductor light-emitting device package 300 according to an example embodiment. FIG. 3 is a view of the same area as the cross-section taken along line B-B' of the semiconductor light-emitting device package 100 illustrated in FIGS. 1A to 1C.

Referring to FIG. 3, a metal guide 340 may surround the light-emitting structure L (please refer to FIG. 1A) in the form of a closed loop. An interconnector 330 may be disposed between the light-emitting laminates 120 (please refer to FIG. 1B) and may extend from one side to the other side of the metal guide 340 in a direction perpendicular to an alignment direction of the light-emitting laminates 120 (please refer to FIG. 1B). The interconnector 330 may electrically connect the light-emitting laminates 120 (please refer to FIG. 1B) in series.

Figure 4A:
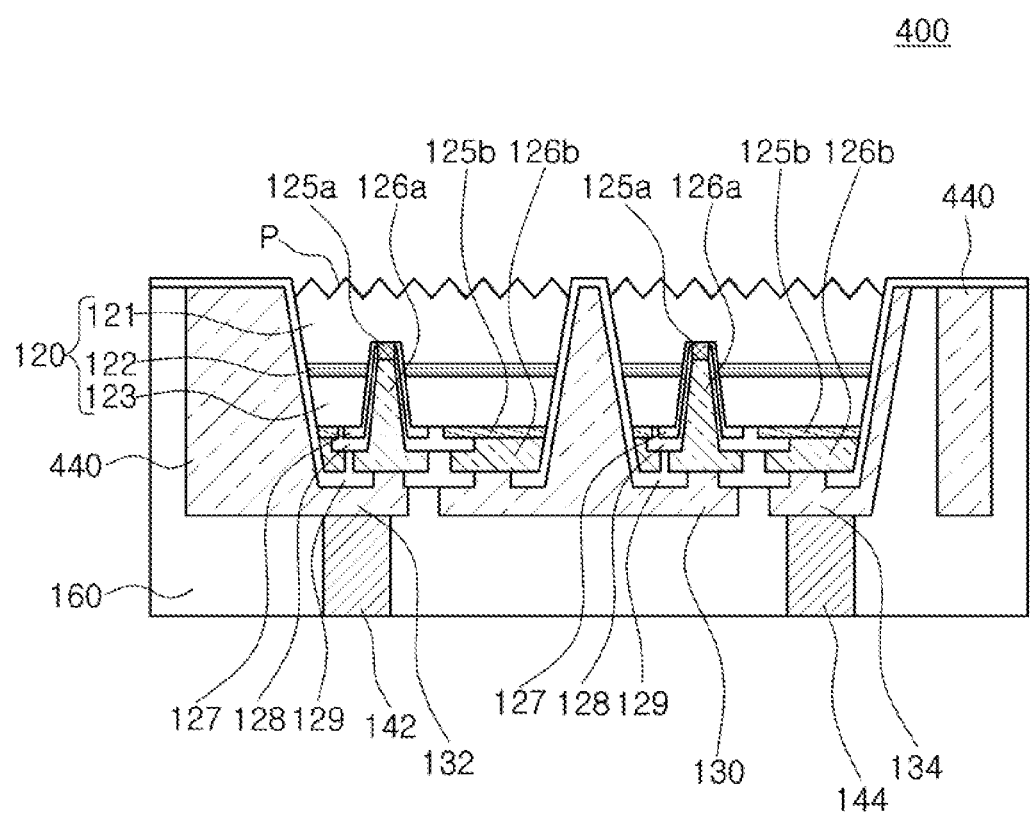
Figure 4B:
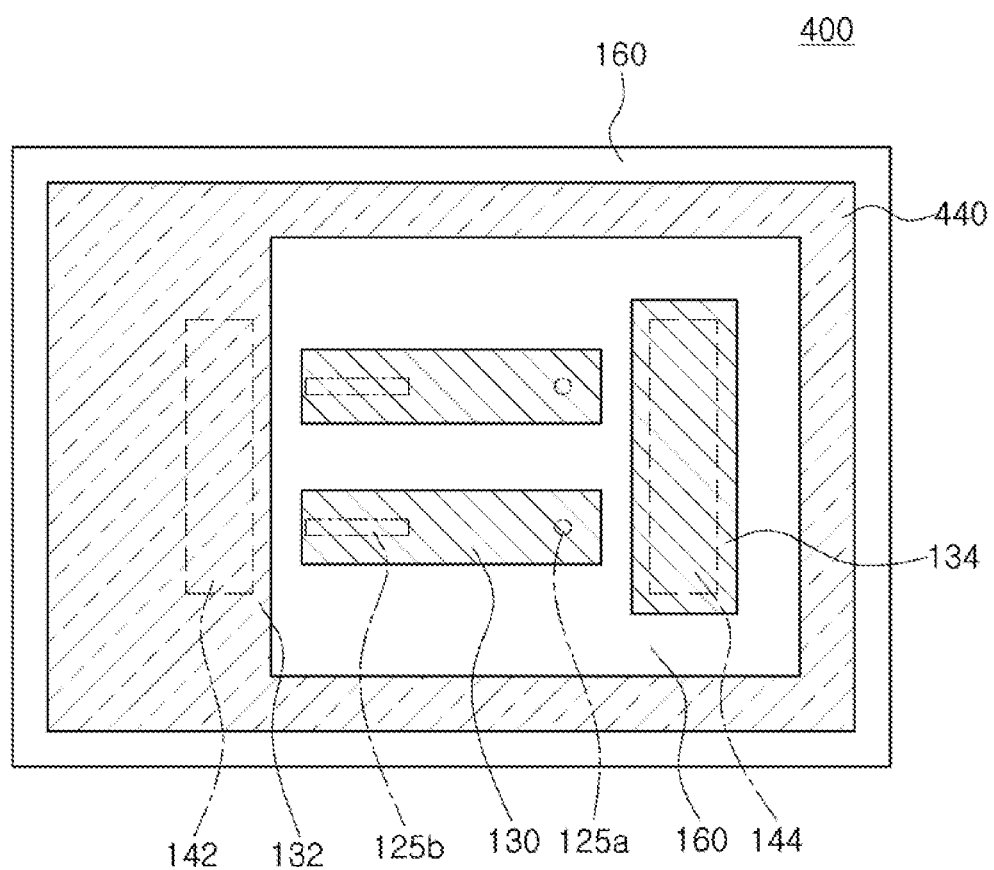

FIGS. 4A and 4B are cross-sectional views of a semiconductor light-emitting device package 400 according to an example embodiment. FIG. 4A is a view of the same area as the cross-section taken along line A-A' of the semiconductor light-emitting device package 100 illustrated in FIGS. 1A to 1C, and FIG. 4B is a view of the same area as the cross-section taken along line B-B' of the semiconductor light-emitting device package 100 illustrated in FIGS. 1A to 1C.

Referring to FIGS. 4A and 4B, a metal guide 440 may surround the light-emitting structure L (please refer to FIG. 1A) in the form of a closed loop. The metal guide 440 may electrically connect at least one of the light-emitting laminates 120 to the first metal post 142 and/or the second metal post 144 corresponding thereto. In other words, the metal guide 440 may function as the first pad 132 (please refer to FIG. 1B) and/or the second pad 134 (please refer to FIG. 1B) without being spaced apart from the light-emitting structure L (please refer to FIG. 1A).

Because the semiconductor light-emitting device packages 200, 300, and 400 illustrated in FIGS. 2 to 4B include the metal guides 240, 340, and 440 having greater areas than that of the semiconductor light-emitting device package 100 illustrated in FIGS. 1A to 1C, cracking of the light-emitting laminates 120 (please refer to FIG. 1B) due to the difference in coefficients of thermal expansion between the light-emitting laminates 120 (please refer to FIG. 1B) and the encapsulant 160 (please refer to FIG. 1B) may be more effectively prevented.

Figure 5A:
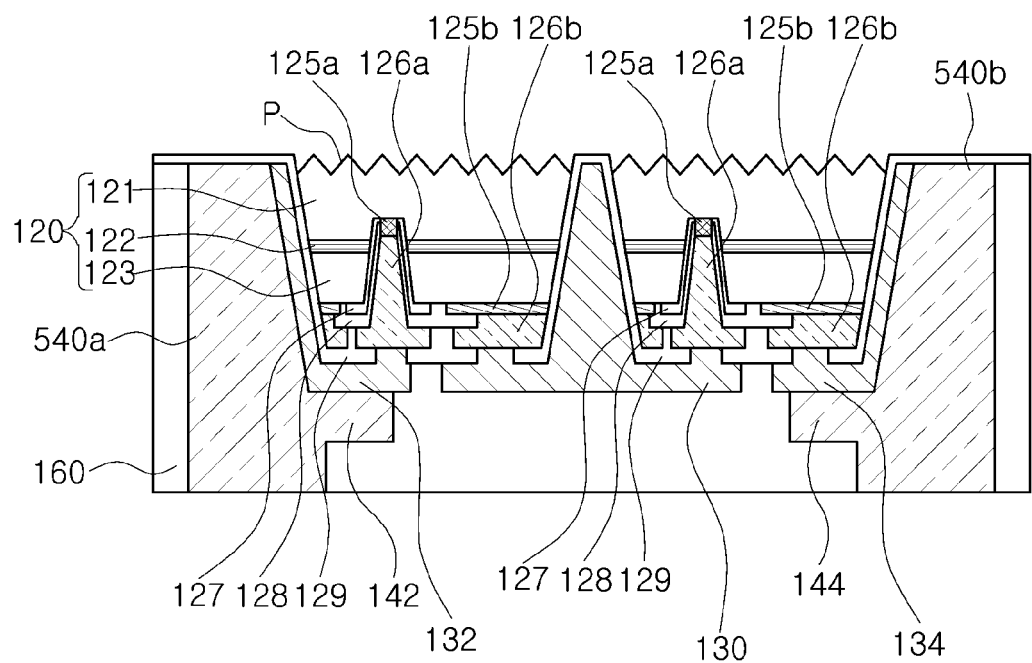
Figure 5B:
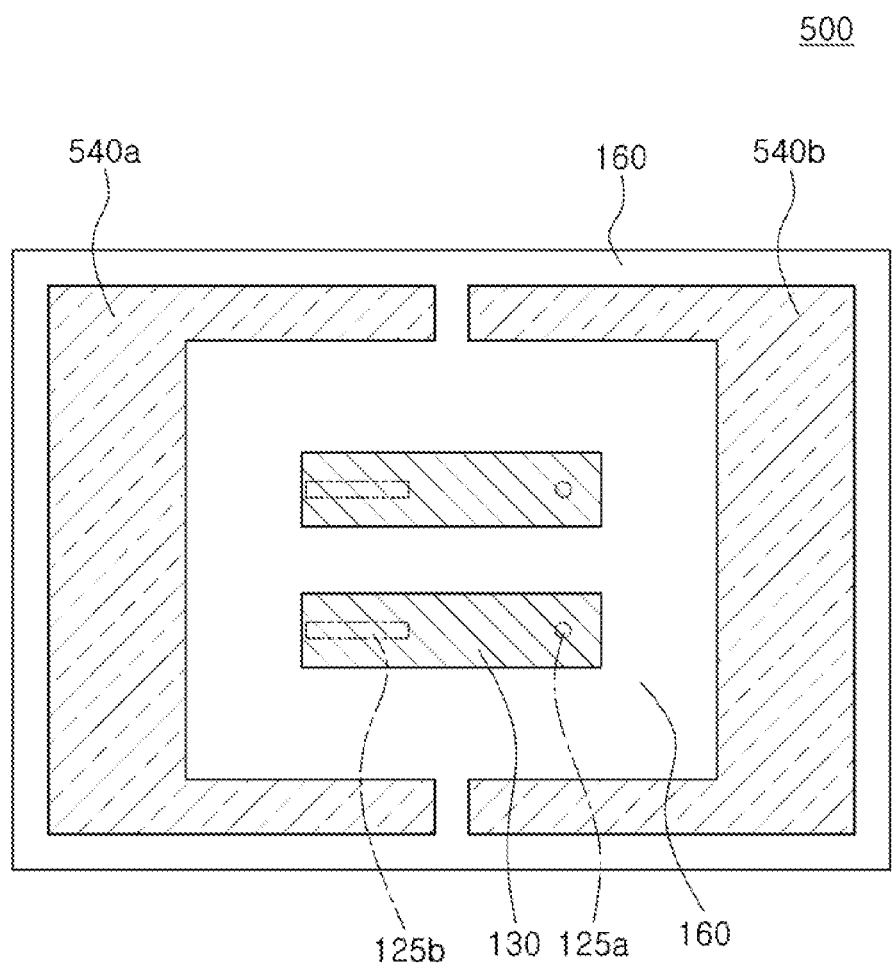

FIGS. 5A and 5B are cross-sectional views of a semiconductor light-emitting device package 500 according to an example embodiment. FIG. 5A is a view of the same area as the cross-section taken along line A-A' of the semiconductor light-emitting device package 100 illustrated in FIGS. 1A to 1C, and FIG. 5B is a view of the same area as the cross-section taken along line B-B' of the semiconductor light-emitting device package 100 illustrated in FIGS. 1A to 1C.

Referring to FIGS. 5A and 5B, first and second metal guides 540a and 540b may be spaced apart from each other and may surround the light-emitting structure L (please refer to FIG. 1B). The first metal guide 540a may be connected to the first interconnection member 126a of one of light-emitting laminates 120, and encapsulated by the encapsulant 160 while an end portion of the first metal guide 540a may be exposed to connect the light-emitting laminates 120 to an external power source. The second metal guide 540b may be connected to the second interconnection member 126b of the other light-emitting laminate 120, and encapsulated by the encapsulant 160 while an end portion of second metal guide 540b may be exposed to connect the other light-emitting laminate 120 to the external power source. In other words, the first metal guide 540a may function as the first metal post 142 and the metal guide 140 (please refer to FIG. 1B) at the same time, and the second metal guide 540b may function as the second metal post 144 and the metal guide 140 (please refer to FIG. 1B) at the same time. Accordingly, an additional process of forming the first and second metal posts 142 and 144 may be omitted.

Figure 6A:
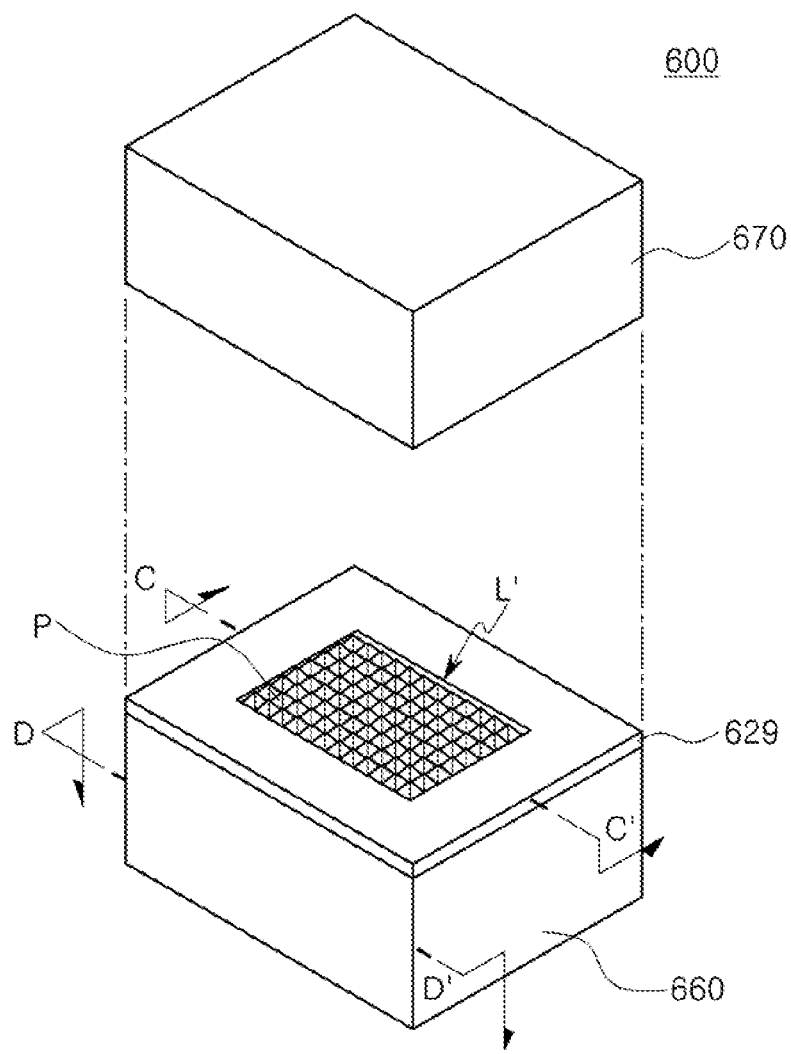
FIG. 6A is an exploded perspective view of a semiconductor light-emitting device package according to an example embodiment.
Figure 6B:
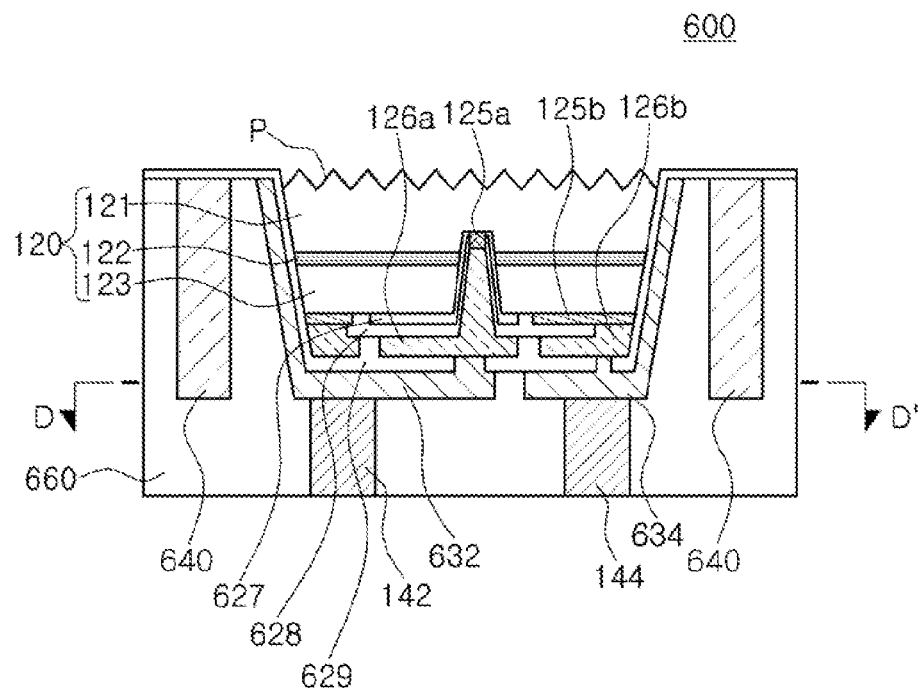
FIG. 6B is a cross-sectional view taken along line C-C' of the semiconductor light-emitting device package illustrated in FIG. 6A.

FIG. 6A is an exploded perspective view of a semiconductor light-emitting device package 600 according to an example embodiment. FIG. 6B is a cross-sectional view taken along line C-C' of the semiconductor light-emitting device package 600 illustrated in FIG. 6A, and FIG. 6C is a cross-sectional view taken along line D-D' of the semiconductor light-emitting device package illustrated in FIG. 6A.

Figure 6C:
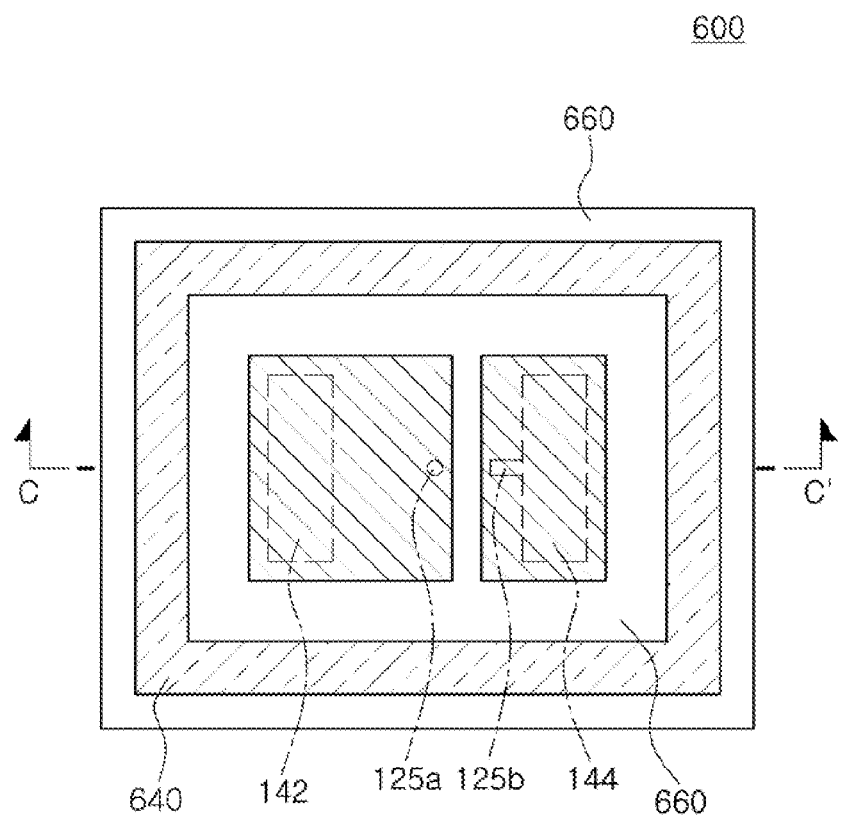
FIG. 6C is a cross-sectional view taken along line D-D' of the semiconductor light-emitting device package illustrated in FIG. 6A.

Referring to FIGS. 6A to 6C, a semiconductor light-emitting device package 600 may include a light-emitting structure L' having a light-emitting laminate 120, first and second contacts 125a and 125b, first and second interconnection members 126a and 126b, first and second pads 632 and 634, and first, second, and third insulating layers 627, 628, and 629, a metal guide 640 surrounding a side of the light-emitting structure L', first and second metal posts 142 and 144 electrically connecting the light-emitting laminate 120 to an external power source, an encapsulant 660 encapsulating the metal guide 640, the first and second metal posts 142 and 144, and the light-emitting structure L', and a phosphor layer 670 disposed on the light-emitting structure L'.

A contact hole passing through a second conductivity-type semiconductor layer 123 and an active layer 122 to expose a first conductivity-type semiconductor layer 121 may be formed. The first insulating layer 627 may be formed on a sidewall of the contact hole and a portion of a lower surface of the second conductivity-type semiconductor layer 123. The first contact 125a in contact with the first conductivity-type semiconductor layer 121 exposed in the contact hole may be disposed. In addition, the second contact 125b may be disposed on a portion of the lower surface of the second conductivity-type semiconductor layer 123 to be electrically connected to the second conductivity-type semiconductor layer 123. The second insulating layer 628 may be disposed between the first contact 125a and the second contact 125b to electrically isolate the first contact 125a from the second contact 125b. The first interconnection member 126a filling the contact hole may be electrically connected to the first contact 125a. The second interconnection member 126b may be disposed on a lower surface of the second contact 125b to be electrically connected to the second contact 125b. The third insulating layer 629 may be disposed between the first interconnection member 126a and the second interconnection member 126b to electrically isolate the first interconnection member 126a from the second interconnection member 126b.

The first pad 632 may electrically connect the first interconnection member 126a to the first metal post 142. In addition, the second pad 634 may electrically connect the second interconnection member 126b to the second metal post 144. The first pad 632 and the first metal post 142 may be sequentially disposed below the first interconnection member 126a. In addition, the second pad 634 and the second metal post 144 may be sequentially disposed below the second interconnection member 126b.

The metal guide 640 may be disposed to be spaced apart from the light-emitting structure L'. The metal guide 640 may surround the sides of the light-emitting structure L' in the form of a closed loop.

The encapsulant 660 may encapsulate the metal guide 640 and the light-emitting structure L' while exposing a light-emitting surface of the light-emitting structure L' and a lower surface of the first and second metal posts 142 and 144 at which the first and second metal posts 142 and 144 are connected to an external power source. The encapsulant 660 may be formed of the same material as the encapsulant 160 illustrated in FIGS. 1A to 1C.

A coefficient of thermal expansion of the metal guide 640 may be greater than a coefficient of thermal expansion of the light-emitting laminates 120, and lower than a coefficient of thermal expansion of the encapsulant 660. Effects resulting therefrom may be the same as those in the semiconductor light-emitting device package 100 illustrated in FIGS. 1A to 1C.

A transparent resin layer 670 including a phosphor may be disposed on the light-emitting structure L'. A wavelength of light emitted from the light-emitting structure L' may be changed by fluorescent particles. Accordingly, the semiconductor light-emitting device package 600 emitting light having a variety of colors may be implemented.

FIGS. 7A to 7H illustrate a method of fabricating the semiconductor light-emitting device package 100 illustrated in FIGS. 1A to 1C. FIGS. 7A to 7H illustrate cross-sections taken along line A-A' in FIGS. 1A to 1C. Hereinafter, descriptions overlapped with those provided with reference to FIGS. 1A to 1C will be omitted.

Figure 7A:
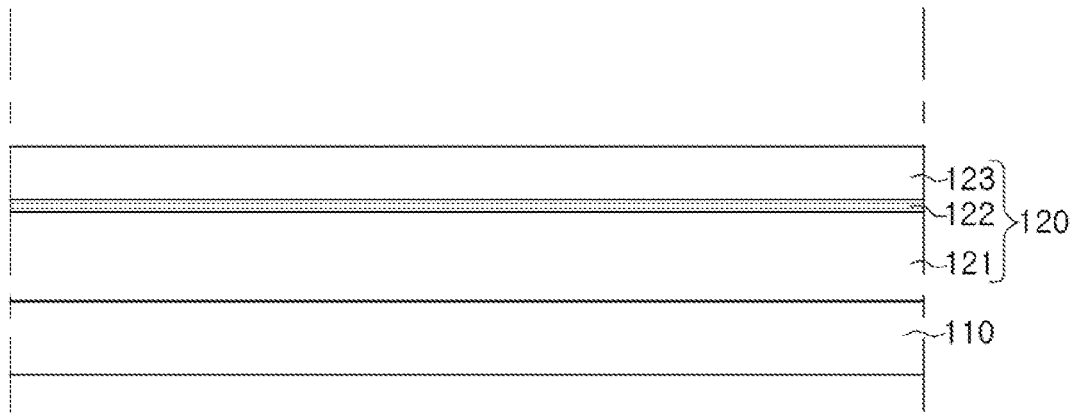
FIGS. 7A to 7H illustrate a method of fabricating a semiconductor light-emitting device package 100 according to an example embodiment.

Referring to FIG. 7A, light-emitting laminates 120 in which a first conductivity-type semiconductor layer 121, an active layer 122, and a second conductivity-type semiconductor layer 123 are sequentially stacked may be formed on a substrate 110 at a wafer level.

The substrate 110 may be an insulating substrate such as sapphire, but the example embodiment is not limited thereto. The substrate 110 may be a conductive substrate or a semiconductor substrate. For example, the substrate 110 may be SiC, Si, $MgAl_2O_4$, MgO, $LiAlO_2$, $LiGaO_2$, or GaN.

Figure 7B:
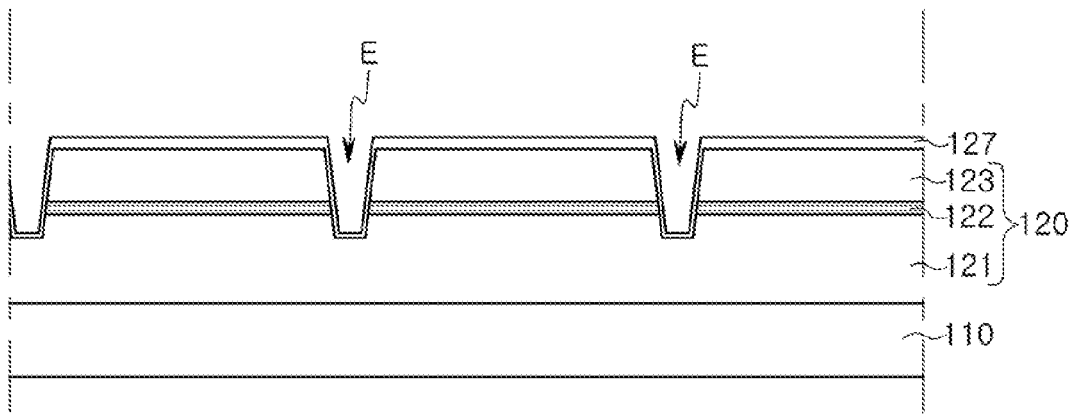

Referring to FIG. 7B, openings E may be formed in the light-emitting laminates 120 to partially expose the first conductivity-type semiconductor layer 121, and then a first insulating layer 127 may be overlaid. One or more openings E may be formed in each light-emitting device package.

Figure 7C:
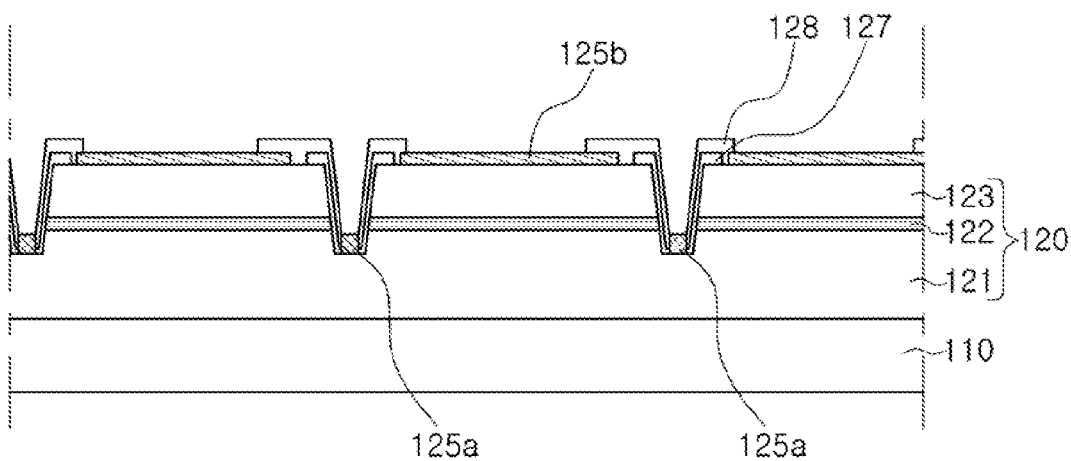

Referring to FIG. 7C, first and second contacts 125a and 125b formed of a conductive ohmic material may be deposited on areas from which portions of the first insulating layer 127 have been removed. The first contact 125a may be deposited on the first conductivity-type semiconductor layer 121 to be electrically connected to the first conductivity-type semiconductor layer 121. The second contact 125b may be deposited on the second conductivity-type semiconductor layer 123 to be electrically connected to the second conductivity-type semiconductor layer 123. Next, a second insulating layer 128 may be formed between the first contact 125a and the second contact 125b to electrically isolate the first contact 125a from the second contact 125b.

Figure 7D:
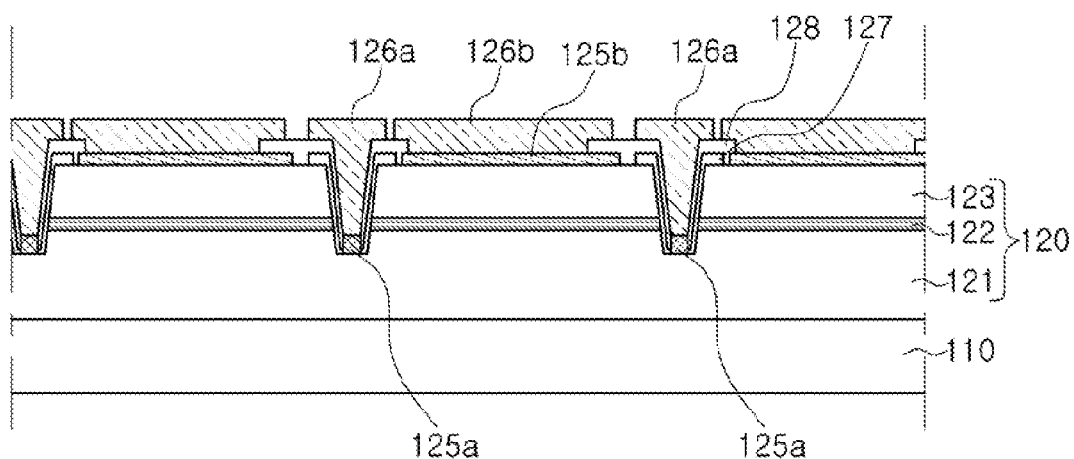

Referring to FIG. 7D, a first interconnection member 126a and a second interconnection member 126b may be respectively formed on the first contact 125a and the second contact 125b to be electrically connected to the first contact 125a and the second contact 125b, respectively.

Figure 7E:
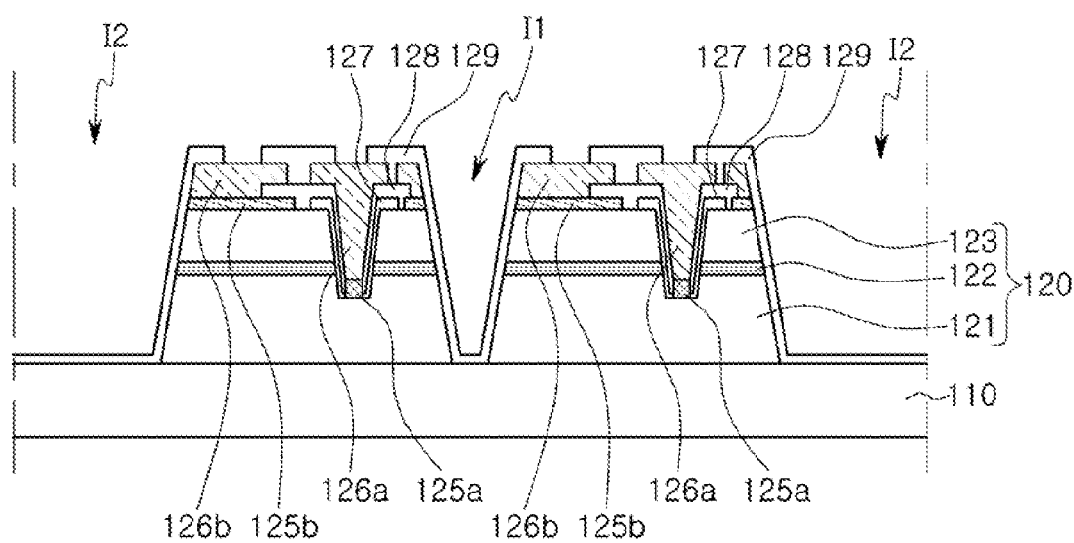

Referring to FIG. 7E, a first isolation member I1 may be formed to isolate the light-emitting laminates 120. In addition, a second isolation member I2 may be formed at each end portion of the light-emitting structure L (please refer to FIG. 1B). The first and second isolation members I1 and I2 may pass through the second insulating layer 128, the second interconnection member 126b, the second contact 125b, and the light-emitting laminates 120 except the substrate 110. A third insulating layer 129 covering side surfaces of the first and second isolation members I1 and I2 to isolate the first interconnection member 126a from the second interconnection member 126b.

The process of forming the first and second isolation members I1 and I2 may be performed using a blade, but is not limited thereto. A cross-section of the light-emitting laminates 120 obtained by the process of forming the first and second isolation members I1 and I2 may have a trapezoidal shape having a top shorter than a bottom.

Figure 7F:
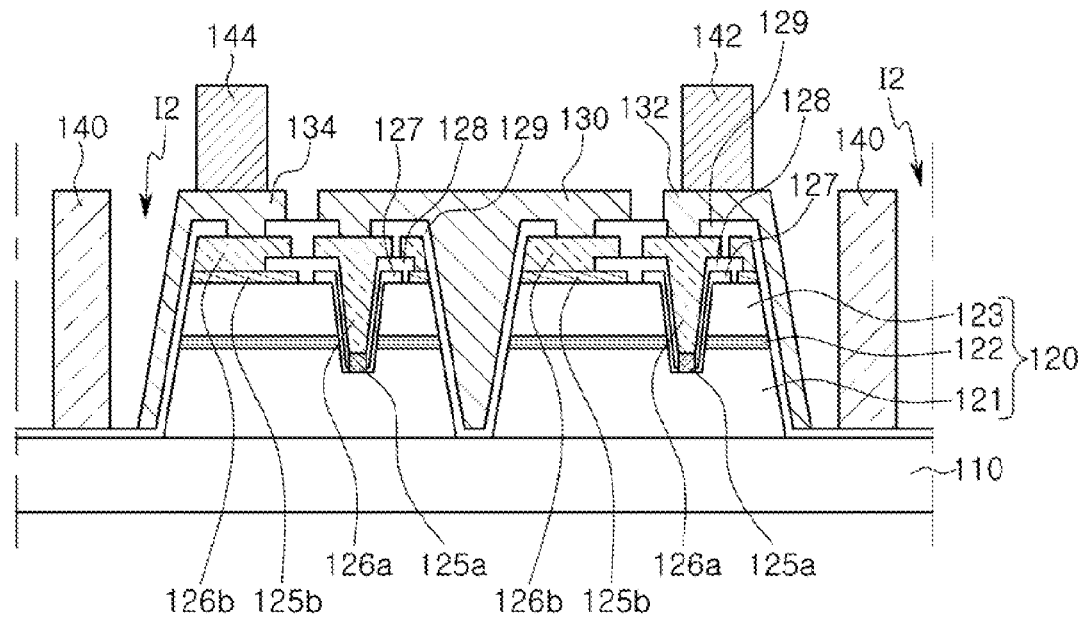

Referring to FIG. 7F, an interconnector 130 may be formed between the light-emitting laminates 120 to electrically connect the light-emitting laminates 120. In detail, the first interconnection member 126a formed on the first conductivity-type semiconductor layer 121 of one of the light-emitting laminates 120 may be connected to the second interconnection member 126b formed on the second conductivity-type semiconductor layer 123 of the other of the light-emitting laminates 120 by the interconnector 130.

A first pad 132 may be formed on the first interconnection member 126a, not connected to the interconnector 130, and a second pad 134 may be formed on the second interconnection member 126b, not connected to the interconnector 130. The interconnector 130 and the first and second interconnection members 126a and 126b may be formed of the same material at the same time.

First and second metal posts 142 and 144 may be respectively formed on the first and second pads 132 and 134 so as to apply external power to the light-emitting laminates 120.

A metal guide 140 may be formed at each end of the light-emitting structure L (please refer to FIG. 1B). The metal guide 140 may be disposed to be spaced apart from the light-emitting structure L (please refer to FIG. 1B). The metal guide 140 may surround the light-emitting structure L (please refer to FIG. 1B) in the form of a closed loop.

Figure 7G:
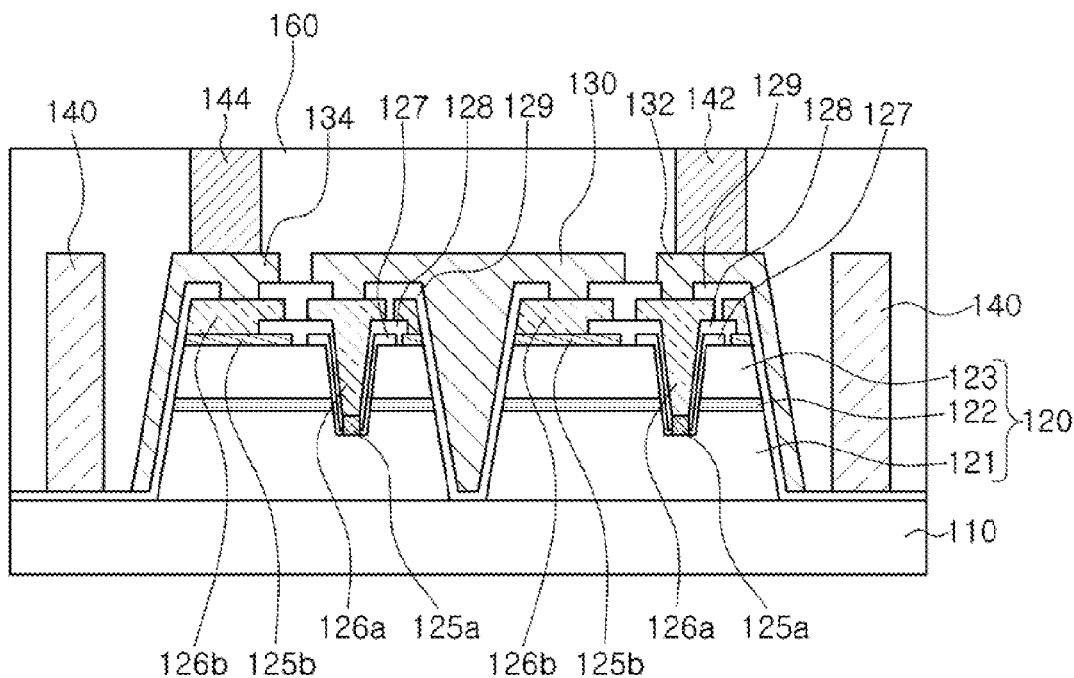

Referring to FIG. 7G, an encapsulant 160 may be formed to encapsulate the metal guide 140, the first and second metal posts 142 and 144, and the light-emitting structure L (please refer to FIG. 1B). The encapsulant 160 may be formed to expose upper surfaces of the first and second metal posts 142 and 144.

Figure 7H:
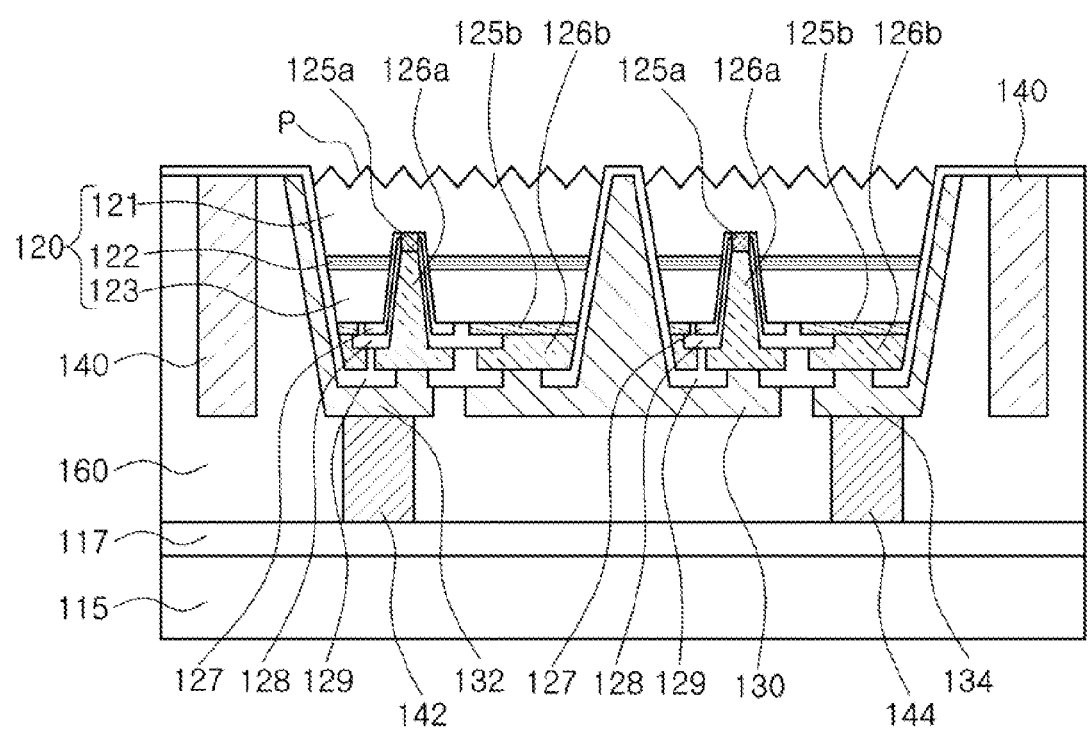

Referring to FIG. 7H, a supporting substrate 115 may be attached by interposing a bonding layer 117 between the supporting substrate 115 and a surface opposing a surface to which the substrate 110 (please refer to FIG. 7G) is bonded. The bonding layer 117 may be formed of, for example, a UV curable material. Next, the substrate 110 (please refer to FIG. 7G) may be removed using a method such as grinding or laser lift-off. In order to increase light extraction efficiency, embossings P may be formed on an upper surface of the first conductivity-type semiconductor layer 121.

Next, a transparent resin layer 170 (please refer to FIG. 1A) including a phosphor may be formed on the light-emitting structure L (please refer to FIG. 1A). The bonding layer 117 and the supporting substrate 115 may be removed to mount the semiconductor light-emitting device package 100 on a mounting substrate.

Figure 8:
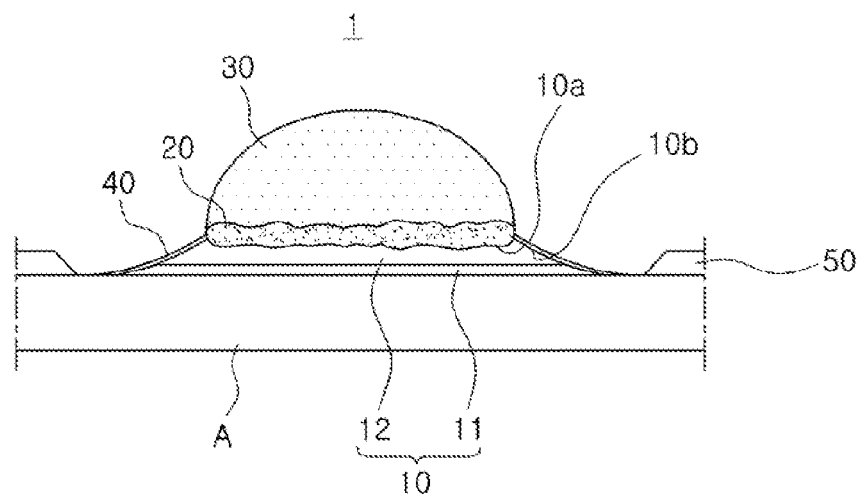
FIG. 8 is a cross-sectional view of an interconnection bump employable in a semiconductor light-emitting device package according to an example embodiment.

FIG. 8 is a cross-sectional view of an interconnection bump 1 employable in a semiconductor light-emitting device package according to an example embodiment. The interconnection bump 1 may be formed below the first and second metal posts 142 and 144 illustrated in FIGS. 1A to 1C.

Referring to FIG. 8, an under-bump metallurgy (UBM) layer 10 may increase an interfacial bonding force between an electrode A of a semiconductor device and a solder bump 30 and provide an electrical path between the semiconductor device and the solder bump 30. According to the example embodiment, the electrode A of the semiconductor device may be the first and second metal posts 142 and 144. In addition, the UBM layer 10 may prevent the solder from diffusing to the electrode A during a reflow process. That is, the UBM layer 10 may prevent a component of the solder from penetrating into the electrode A.

The UBM layer 10 may include a first surface 10a disposed opposing a surface of the electrode A while being in contact with an intermetallic compound (IMC) 20 on the electrode A, and a second surface 10b extending from an edge of the first surface 10a to be connected to the electrode A.

The first surface 10a may have an even surface as a whole, and define an upper surface of the UBM layer 10. The second surface 10b may be gently inclined from the first surface 10a toward the electrode A, and may define side surfaces of the UBM layer 10.

The UBM layer 10 may be formed of a metal so as to be electrically connected to the electrode A. For example, the UBM layer 10 may have a laminate structure including a titanium (Ti) layer 11 in contact with the electrode A and a nickel (Ni) layer 12 disposed on the Ti layer 11. Alternatively, the UBM layer 10 may have a laminate structure including the Ti layer 11 and a copper (Cu) layer, instead of the Ni layer 12, disposed on the Ti layer 11.

In the example embodiment, the UBM layer 10 is illustrated as having a Ti—Ni laminate structure, but the example embodiment is not limited thereto. For example, the UBM layer 10 may have a laminate structure including a chromium (Cr) layer in contact with the electrode A and a Ni layer disposed on the Cr layer, or a laminate structure including a Cr layer and a Cu layer disposed on the Cr layer.

In addition, in the example embodiment, the UBM layer 10 is illustrated as having a multilayer structure, but the example embodiment is not limited thereto. For example, the UBM layer 10 may have a single layer structure including a Ni layer or a Cu layer.

The UBM layer 10 may be formed by, for example, sputtering, e-beam deposition, or plating.

The IMC 20 may be formed on the first surface 10a of the UBM layer 10. The IMC 20 may be formed in a reflow process for forming the solder bump 30. The IMC 20 may be formed by a reaction of tin (Sn) in the solder with a metal in the UBM layer 10, such as Ni, and may form a Sn—Ni binary alloy.

The solder bump 30 may be bonded with the UBM layer 10 by the media of the IMC 20. That is, the solder bump 30 may be strongly bonded to the UBM layer 10 by the intermetallic compound 20 functioning as an adhesive.

The solder bump 30 may be formed by reflowing the solder disposed on the UBM layer 10. The solder may include, for example, a conventional SAC305 ($Sn_{96.5}Ag_{3.0}Cu_{0.5}$).

A barrier layer 40 may be formed to cover the second surface 10b of the UBM layer 10. The barrier layer 40 may serve to minimize wettability with respect to the solder bump 30 and thereby prevent the intermetallic compound 20 and the solder bump 30 from diffusing to the second surface 10b. This can be achieved by configuring the barrier layer 40 with a material having a sufficiently low wettability with respect to the intermetallic compound 20 and the solder bump 30.

The barrier layer 40 may be an oxide layer containing at least one of the components of the UBM layer 10. For example, the barrier layer 40 may be an oxide layer containing at least one of Ni and Cu. The barrier layer 40 may be formed by oxidizing the second surface 10b of the UBM layer 10. For example, the barrier layer 40 may be formed by oxidizing the second surface 10b of the UBM layer 10 using a thermal oxidation process or a plasma oxidation process.

Meanwhile, a passivation layer 50 may be disposed around the UBM layer 10 on the electrode A. The passivation layer 50 may be formed of, for example, $SiO_2$.

The passivation layer 50 may be spaced apart from the UBM layer 10 at a predetermined distance on the electrode A and may not be in contact with the UBM layer 10. In addition, the passivation layer 50 may have a thin-film structure, and be lower than the UBM layer 10. That is, the first surface 10a of the UBM layer 10 may be disposed higher than an upper surface of the passivation layer 50 on the basis of the surface of the electrode A.

According to the example embodiment, the passivation layer 50 is illustrated as being disposed around the UBM layer 10, but the example embodiment is not limited thereto. The passivation layer 50 may be selectively included. Such a bump structure may be usefully applied to the other packages described above.

Figure 9A:
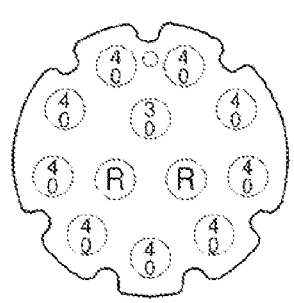
FIGS. 9A and 9B are schematic diagrams of a white light source module employing a semiconductor light-emitting device package according to an example embodiment.
Figure 9B:
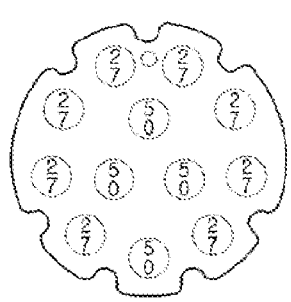

FIGS. 9A and 9B are schematic diagrams of a white light source module employing a semiconductor light-emitting device package according to example embodiments.

Referring to FIGS. 9A and 9B, the light source module may include a plurality of light-emitting device packages, each of which is mounted on a circuit board. The plurality of light-emitting device packages mounted on a single light source module may be configured with the same type packages generating light of the same wavelength, or may be configured with different types of packages generating light of different wavelengths as illustrated in the example embodiment of the present invented concept.

Referring to FIG. 9A, a white light source module may be formed by combining white light-emitting device packages having color temperatures of 4,000 K and 3,000 K with red light-emitting device packages. The white light source module may provide white light having a color temperature controlled within the range of 3,000 K to 4,000 K and a color rendering index Ra in the range of 105 to 100.

Referring to FIG. 9B, the white light source module may be formed only with the white light-emitting device packages, but some of the white light-emitting device packages may emit white light having a different color temperature. For example, by combining a white light-emitting device package having a color temperature of 2,700 K and a white light-emitting device package having a color temperature of 5,000 K, white light having a color temperature controlled in the range of 2,700 K to 5,000 K and a color rendering index Ra in the range of 85 to 99 may be provided. Here, the number of light-emitting device packages having a certain color temperature may be changed, mainly depending on a set value of a default color temperature. For example, when a set value of a default color temperature of a lighting apparatus is about 4,000 K, the number of light-emitting device packages corresponding to the color temperature of 4,000 K may be greater than the number of light-emitting device packages corresponding to a color temperature of 3,000 K or the number of the red light-emitting device packages.

In this manner, the color temperature and the color rendering index (hereinafter, CRI) of white light may be controlled by configuring a heterogeneous light-emitting device package to include a light-emitting device emitting white light by combining yellow, green, red, or orange phosphor with a blue light-emitting device, and at least one of purple, blue, green, red, and infrared light-emitting devices.

Figure 22:
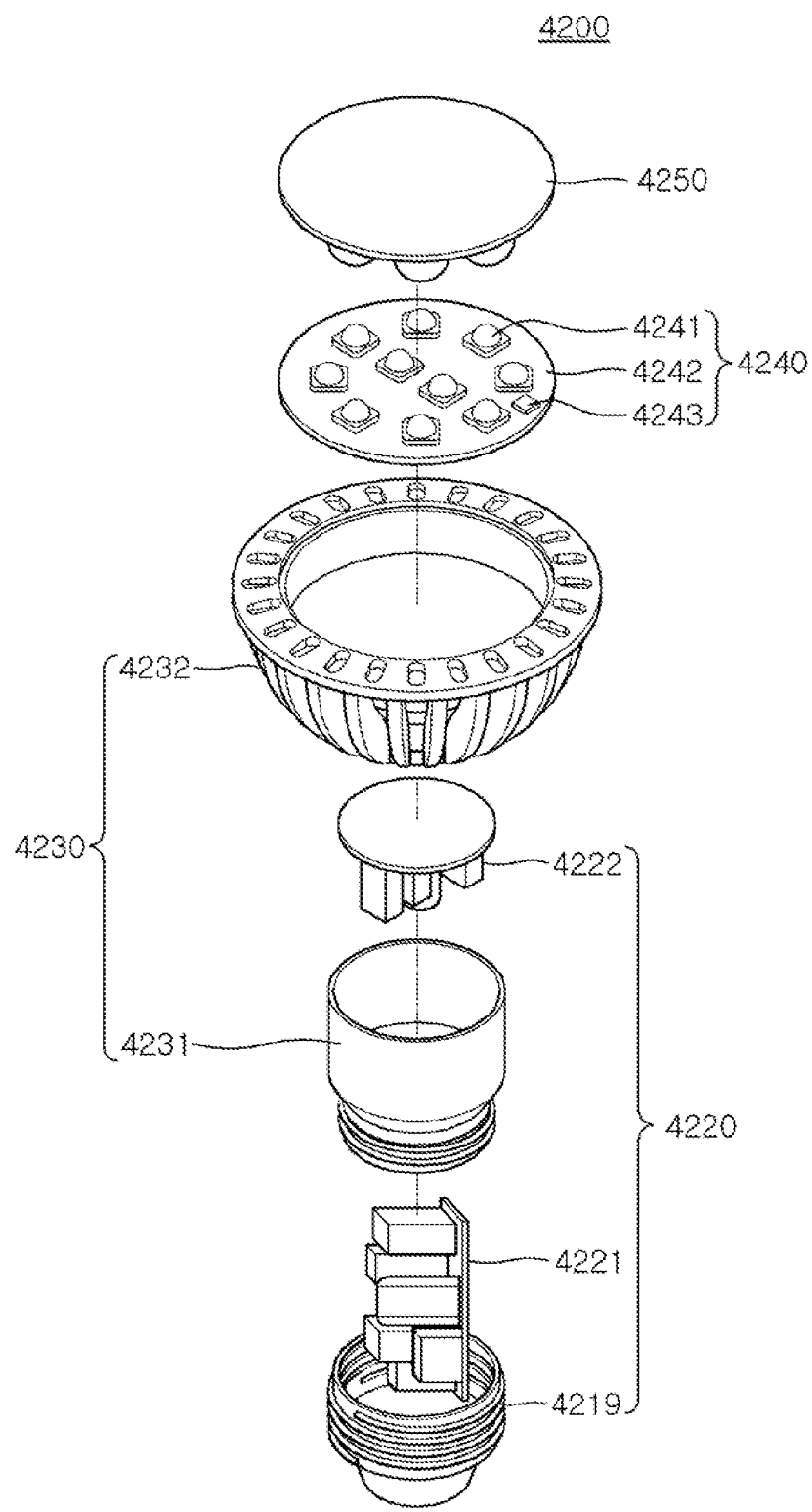
FIG. 22 is an exploded perspective view of a lamp including a semiconductor light-emitting device package and a communications module according to an example embodiment.
Figure 23:
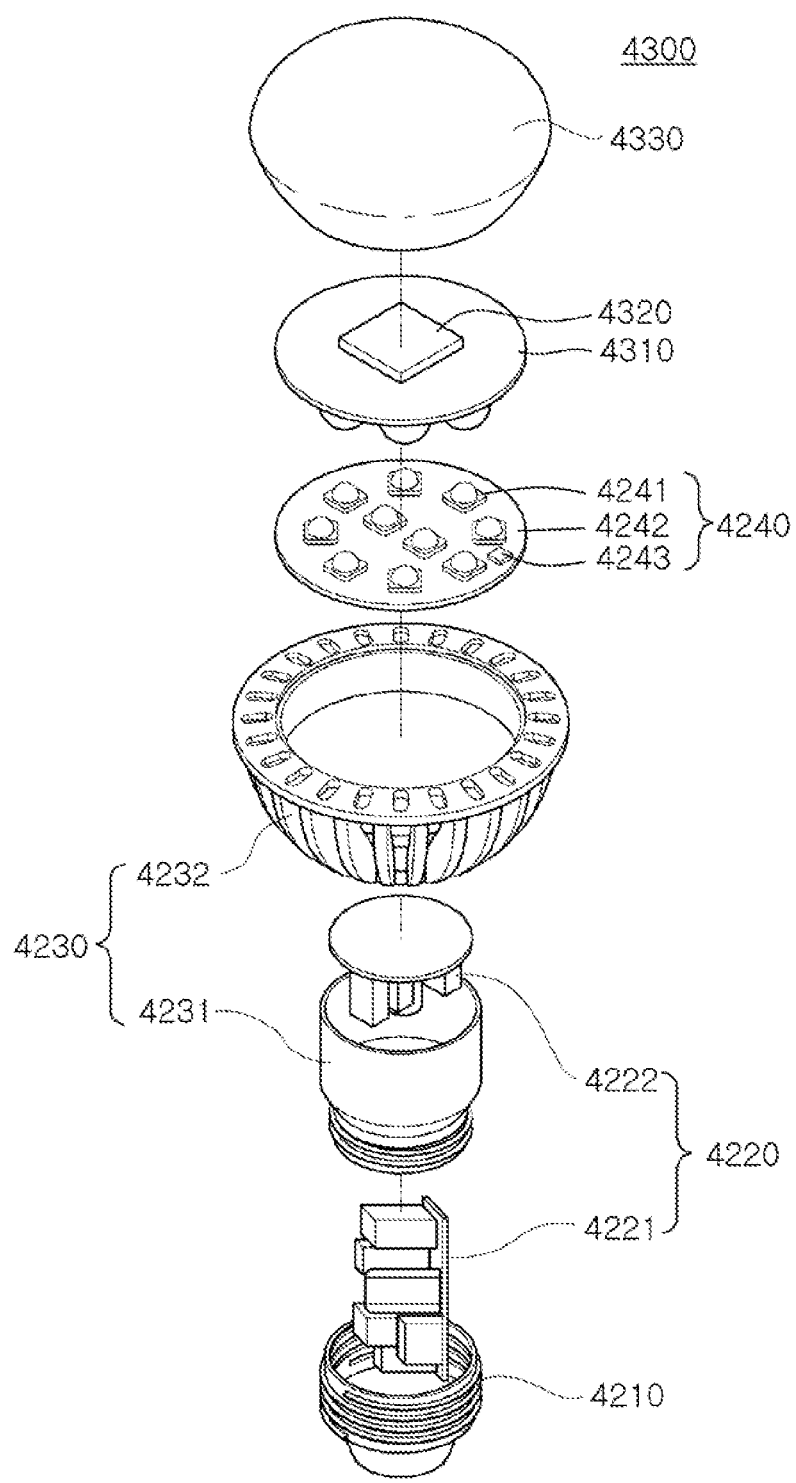
FIG. 23 is an exploded perspective view of a lamp including a semiconductor light-emitting device package and a communications module according to an example embodiment.

The above-described white light source module may be used as a light source module 4240 of a bulb-type lighting apparatus (reference numeral 4200 of FIG. 22 or 4300 of FIG. 23).

In a single light-emitting device package, light of a preferred color may be determined according to a wavelength of an LED chip, that is, the light-emitting device and a type and mixing ratio of the phosphor. In addition a color temperature and CRI of white light may be controlled.

For example, when an LED chip emits blue light, a light-emitting device package including at least one of yellow, green, and red phosphor may emit white light having a variety of color temperatures depending on a mixing ratio of the phosphor. Alternatively, a light-emitting device package including a blue LED chip and a green or red phosphor may emit green or red light. In this manner, a color temperature and CRI of white light may be controlled by combining a light-emitting device package emitting white light and a light-emitting device package emitting green or red light. In addition, the light-emitting device package may be configured to include at least one light-emitting device emitting purple, blue, green, red, or infrared light.

In such a case, the lighting apparatus may be controlled to have the CRI in the range from a level of a sodium (Na) lamp to a level of sunlight, and may generate white light having a variety level of color temperature in the range of about 1500K to 20000K. In addition, since the lighting apparatus emits visible light having a purple, blue, green, red, or orange color, or infrared light, as needed, and the color of the lighting apparatus may be controlled according to an environment or mood. In addition, the LED chip 110 may emit light having a specific wavelength to promote plant growth.

Figure 10:
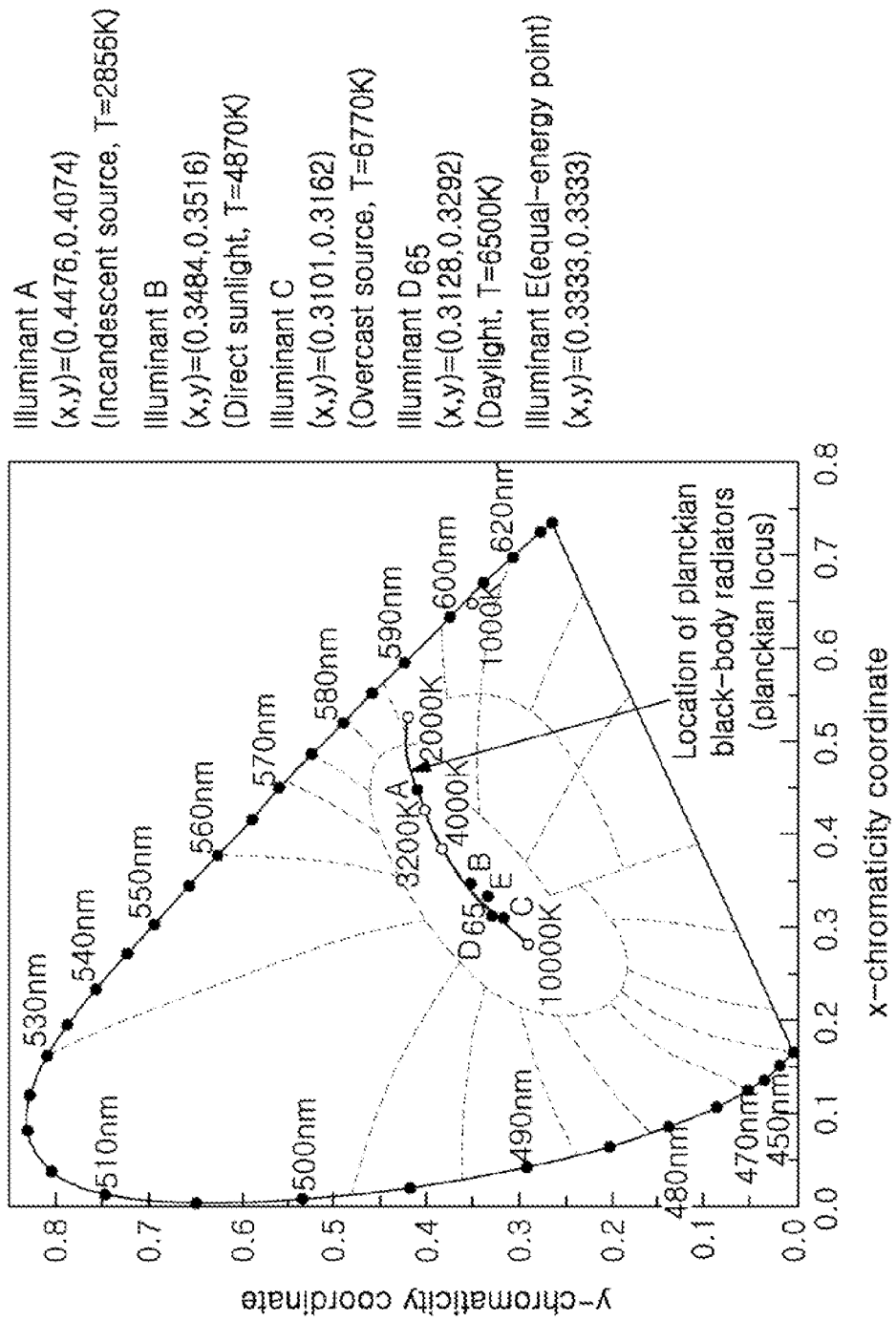
FIG. 10 is a CIE color space diagram provided to illustrate a wavelength-converting material employable in a semiconductor light-emitting device package according to an example embodiment.

FIG. 10 is a CIE color space diagram provided to illustrate a wavelength-converting material usable in a semiconductor light-emitting device package according to example embodiments of the present disclosure.

Referring to the CIE 1931 color space diagram illustrated in FIG. 10, white light formed by combination of a UV or blue LED, and yellow, green, and red phosphor and/or green and red LEDs may have two or more peak wavelengths, and may be located on the line connecting (x, y) coordinates of (0.4476, 0.4074), (0.3484, 0.3516), (0.3101, 0.3162), (0.3128, 0.3292), (0.3333, 0.3333) in the CIE 1931 color space diagram illustrated in FIG. 10. Otherwise, the white light may be located in a zone surrounded by the line and a black body radiation spectrum. The color temperature of the white light may corresponds to 2000K to 20000K.

As a material converting a wavelength of light emitted from a semiconductor light-emitting device, various materials, such as a phosphor and/or a quantum dot may be used.

The fluorescent materials may have compositional formulas and colors as follows.

Oxide group: yellow and green $Y_3Al_5O_{12}$:Ce, $Tb_3Al_5O_{12}$:Ce, $Lu_3Al_5O_{12}$:Ce Silicate group: yellow and green $(Ba,Sr)_2SiO_4$:Eu, yellow and orange $(Ba,Sr)_3SiO_5$:Ce Nitride group: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z≤0.3, and 0<y≤4)—Formula (1)

(In Formula (1), Ln is at least one element selected from the group consisting of a Group Ma element and a rare earth element, and M is at least one element selected from the group consisting of Ca, Ba, Sr, and Mg)

Fluoride group: KSF-based red $K_2SiF_6$:$Mn_4$+, $K_2TiF_6$:$Mn_4^+$, $NaYF_4$:$Mn_4^+$, $NaGdF_4$:$Mn_4^+$ (for example, a composition ratio of Mn may be 0<z≤0.17)

Basically, the composition of the phosphor may be consistent with stoichiometry, and each element may be substituted with another element within a corresponding group on the periodic table. For example, strontium (Sr) may be substituted with Ba, Ca, Mg, or the like in the alkaline earth (II) group, and Y may be substituted with Tb, Lu, Sc, Gd, or the like in the lanthanide group. In addition, Eu, an activator, may be substituted with Ce, Tb, Pr, Er, Yb, or the like according to a preferred energy level. The activator may be used alone, or a coactivator may be further included in order to change characteristics.

In particular, each fluoride-based red phosphor may be coated with a fluoride without containing Mn, or a surface of the red phosphor or a coated surface of the fluoride without containing Mn may be further coated with an organic material, in order to improve reliability in high temperature/high humidity environments. Unlike the other fluorescent substances, such a fluoride-based red fluorescent substance may implement a narrow full width at half maximum (FWHM) of 40 nm or less, and therefore may be used in a high-definition TV such as a UHD TV.

Table 1 below illustrates various types of phosphor of a white light-emitting device using a blue LED chip (440 nm to 460 nm) or a UV LED chip (380 nm to 440 nm), listed by applications.

TABLE 1

| Purpose | Phosphor |
|---|---|
| LED TV BLU | β-SiAlON:$Eu^{2+}$, (Ca, Sr)$AlSiN_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, and 0 < y ≤ 4), $K_2TiF_6$:$Mn^{4+}$, $NaYF_4$:$Mn^{4+}$, $NaGdF_4$:$Mn^{4+}$ |
| Lighting Apparatuses | $Lu_3Al_5O_{12}$:$Ce^{3+}$, Ca-α-SiAlON:$Eu^{2+}$, $La_3Si_6N_{11}$:$Ce^{3+}$, (Ca, Sr)$AlSiN_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}Ni_{8-x-y}$ (0.5 ≤ x ≤ 3, 0 < z < 0.3, and 0 < y ≤ 4), $K_2TiF_6$:$Mn^{4+}$, $NaYF_4$:$Mn^{4+}$, $NaGdF_4$:$Mn^{4+}$ |
| Side Viewing (Mobile Devices, Notebook PCs) | $Lu_3Al_5O_{12}$:$Ce^{3+}$, Ca-α-SiAlON:$Eu^{2+}$, $La_3Si_6N_{11}$:$Ce^{3+}$, (Ca, Sr)$AlSiN_3$:$Eu^{2+}$, $Y_3Al_5O_{12}$:$Ce^{3+}$, (Sr, Ba, Ca, Mg)$_2SiO_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, and 0 < y ≤ 4), $K_2TiF_6$:$Mn^{4+}$, $NaYF_4$:$Mn^{4+}$, $NaGdF_4$:$Mn^{4+}$ |
| Electronics (Vehicle Headlamps, etc.) | $Lu_3Al_5O_{12}$:$Ce^{3+}$, Ca-α-SiAlON:$Eu^{2+}$, $La_3Si_6N_{11}$:$C^{3+}$, (Ca, Sr)$AlSiN_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, and 0 < y ≤ 4), $K_2TiF_6$:$Mn^{4+}$, $NaYF_4$:$Mn^{4+}$, $NaGdF_4$:$Mn^{4+}$ |

In addition, a wavelength converter may replace the phosphor, or may be mixed with the phosphor. The wavelength converter may include wavelength-converting materials, such as quantum dots QD.

Figure 11:
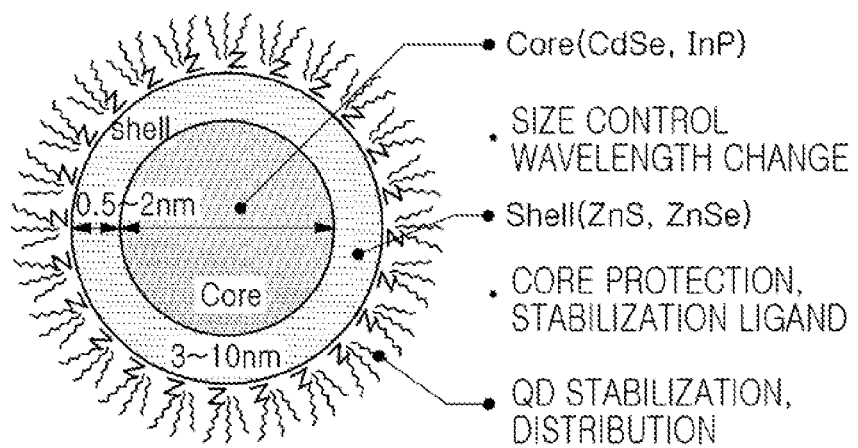
FIG. 11 is a cross-sectional view of a quantum dot employable in a semiconductor light-emitting device package according to an example embodiment.

FIG. 11 is a cross-sectional view of a quantum dot used in a semiconductor light-emitting device package according to an example embodiment.

Referring to FIG. 11, a quantum dot (QD) may have a core-shell structure formed of II-VI group or III-V group compound semiconductor. For example, the quantum dot may include a core, such as CdSe or InP, and a shell, such as ZnS or ZnSe. In addition, the quantum dot may further include a ligand for stabilizing the core and the shell. For example, a diameter of the core may be in the range of 1 nm to 30 nm, and preferably 3 nm to 10 nm. A thickness of the shell may be in the range of 0.1 nm to 20 nm, and preferably 0.5 nm to 2 nm.

The quantum dot may implement a variety of colors according to a size thereof. In particular, when the quantum dot is used as a substitute material for the phosphor, the quantum dot may be used as a red or green phosphor. When the quantum dot is used, a narrow FWHM (e.g. about 35 nm) may be implemented.

The wavelength-converting material may be implemented in such a manner to be included in an encapsulant. Alternatively, the wavelength-converting material may be prepared as a film in advance to be attached to a surface of an LED chip or an optical structure such as a light guide plate. In this case, the wavelength-converting material may have a uniform thickness to be easily applied to a preferred area.

Figure 12:
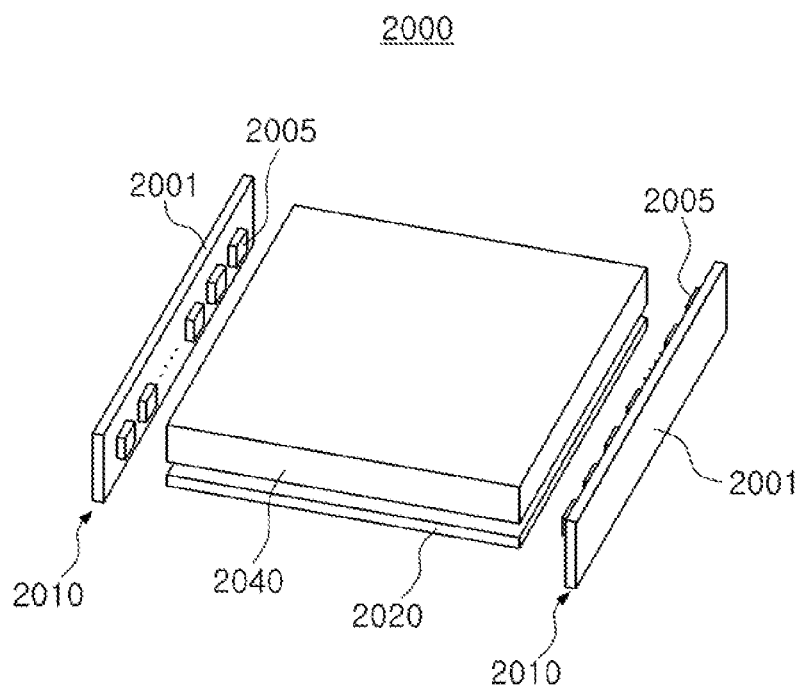
FIG. 12 is a perspective view of a backlight unit employing a semiconductor light-emitting device package according to an example embodiment.

FIG. 12 is a perspective view of a backlight unit 2000 employing a semiconductor light-emitting device package according to an example embodiment.

Referring to FIG. 12, a backlight unit 2000 may include a light guide plate 2040 and a light source module 2010 disposed at each side of the light guide plate 2040. In addition, the backlight unit 2000 may further include a reflector 2020 disposed below the light guide plate 2040. The backlight unit 2000 according to the example embodiment of the present inventive concept may be an edge-type backlight unit.

In some example embodiments, the light source module 2010 may be provided on only one side of the light guide plate 2040, or additionally provided to the other side of the light guide plate 2040. The light source module 2010 may include a printed circuit board (PCB) 2001 and a plurality of light sources 2005 mounted on the PCB 2001.

Figure 13:
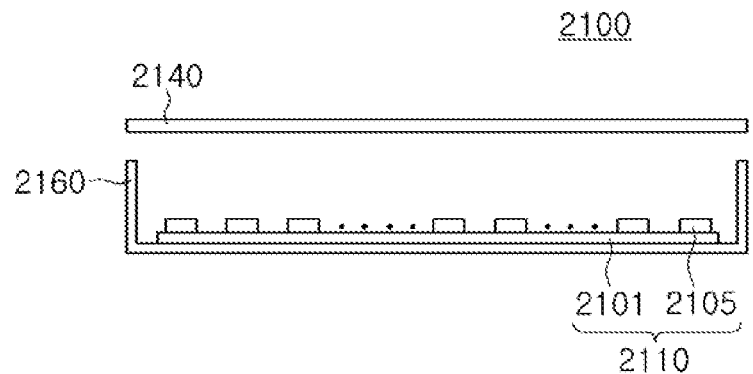
FIG. 13 is a cross-sectional view of a direct-type backlight unit employing a semiconductor light-emitting device package according to an example embodiment.

FIG. 13 is a cross-sectional view of a direct-type backlight unit 2100 employing a semiconductor light-emitting device package according to an example embodiment.

Referring to FIG. 13, a backlight unit 2100 may include a light diffusion plate 2140 and a light source module 2110 disposed below the light diffusion plate 2140. In addition, the backlight unit 2100 may further include a bottom case 2160 disposed below the light diffusion plate 2140 and accommodating the light source module 2110. The backlight unit 2100 according to the example embodiment may be a direct-type backlight unit.

The light source module 2110 may include a PCB 2101 and a plurality of light sources 2105 mounted on the PCB 2101.

Figure 14:
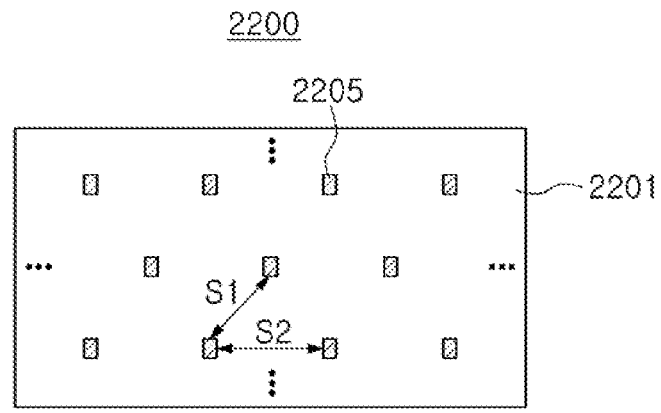
FIG. 14 is a plan view illustrating an arrangement of light sources of a direct-type backlight unit employing a semiconductor light-emitting device package according to an example embodiment.

FIG. 14 is a plan view illustrating an arrangement of light sources of a direct-type backlight unit employing a semiconductor light-emitting device package according to an example embodiment.

The direct-type backlight unit 2200 according to the example embodiment may include a plurality of light sources 2205 arranged on a substrate 2201.

The light sources 2205 may have a matrix structure arranged in rows and columns, wherein the light sources 2205 of each of the rows are offset from corresponding light sources 2205 adjacent rows and the light sources 2205 of each of columns are offset from corresponding light sources 2205 adjacent columns as shown in the figure. This may be understood that a light source 2205 belonging to the second matrix is disposed inside a square formed by four adjacent light sources 2205 belonging to the first matrix.

However, the first matrix and the second matrix may be arranged in different structures and at different intervals, as needed in order to improve brightness uniformity and light efficiency in the direct-type backlight unit. Besides the arrangement structure of the plurality of light sources, distances S1 and S2 between adjacent light sources may be optimized to ensure the brightness uniformity.

In this manner, the rows and columns consisting of the light sources 2205 may be arranged not in straight lines but in zigzags, and thus the number of light sources 2205 may be reduced by about 15% to 25% with respect to the same light-emitting area.

Figure 15:
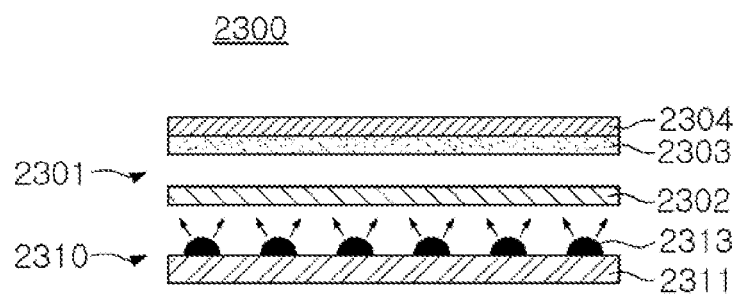
FIG. 15 is a cross-sectional view of a direct-type backlight unit employing a semiconductor light-emitting device package according to an example embodiment.

FIG. 15 is a cross-sectional view of a direct-type backlight unit 2300 employing a semiconductor light-emitting device package according to an example embodiment.

Referring to FIG. 15, a backlight unit 2300 according to the example embodiment may include an optical sheet 2301 and a light source module 2310 disposed below the optical sheet 2301.

The optical sheet 2301 may include a diffusion sheet 2302, a collecting sheet 2303, and a protection sheet 2304.

The light source module 2310 may include a circuit board 2311 and optical devices 2313 mounted on the circuit board 2311. The optical devices 2313 may include a plurality of light sources and optical substances disposed on the plurality of light sources. The plurality of light sources may be the white light source module illustrated in FIG. 1A to 6C.

The optical substances may control an orientation angle of light through refraction of light. In particular, a wide orientation angle lens spreading light emitted from the light sources in a wide area may be mainly used. Since the light sources having the optical substances thereon have a more wide light distribution, the number of light sources required for the same area may be saved when the light source module is used in a backlight or a plat panel light.

Figure 16:
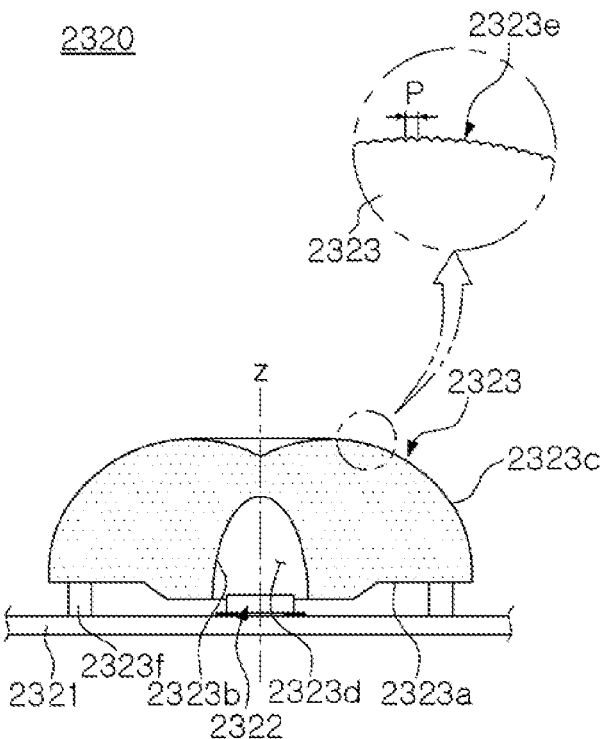
FIG. 16 is a cross-sectional view of an optical device employing a semiconductor light-emitting device package according to an example embodiment.

FIG. 16 illustrates an optical device 2320 employing a semiconductor light-emitting device package according to an example embodiment.

Referring to FIG. 16, the optical device 2320 may include a light source 2322 and an optical substance 2323 disposed on the light source 2322. The optical device 2320 may be the optical device 2313 illustrated in FIG. 15.

The optical substance 2323 may include a bottom surface 2323a disposed on the light sources 2322, an incident surface 2323b on which light emitted from the light sources 2322 is incident, and an emitting surface 2323c through which the light is emitted to the outside.

The bottom surface 2323a may include a groove 2323d recessed toward the emitting surface 2323c in a center through which an optical axis Z of the light sources 2322 passes. A surface of the groove 2323d may be defined as the incident surface 2323b through which the light sources 2322 is incident. That is, the incident surface 2323b may form the surface of the groove 2323d.

The bottom surface 2323a may have a non-planar structure as a whole, in which a center portion connected to the incident surface 2323b in the bottom surface 2323a partially protrudes toward the light sources 2322. That is, different from a normal structure in which the entire bottom surface 2323a is planar, the bottom surface 2323a may partially protrude around the groove 2323d. A plurality of supports 2323f may be disposed on the bottom surface 2323a. When the optical substance 2323 is mounted on a circuit board 2321, the plurality of supports 2323f may fixidly support the optical substance 2323.

The emitting surface 2323c may upwardly (in a light-emitting direction) protrude from an edge connected to the bottom surface 2323a in a dome shape, and a center portion through which the optical axis Z passes may be concavely recessed toward the groove 2323d to have an inflection point.

A plurality of embossings 2323e may be periodically arranged on the emitting surface 2323c from the optical axis Z toward the edge. The plurality of embossings 2323e may have a ring shape corresponding to a horizontal cross-section of the optical substance 2323, and may form concentric circles with the optical axis Z as a center. In addition, the plurality of embossings 2323e may be arranged to radially spread along the emitting surface 2323c to form a periodic pattern.

The plurality of embossings 2323e may be spaced apart in a regular pitch P to form a pattern. In this case, the pitch P between the plurality of embossings 2323e may be in the range of 0.01 mm to 0.04 mm. The plurality of embossings 2323e may compensate for differences in performance between the optical substances 2323 due to small processing errors generated in a process of fabricating the optical substances 2323, and thereby improve uniformity in optical distribution.

Figure 17:
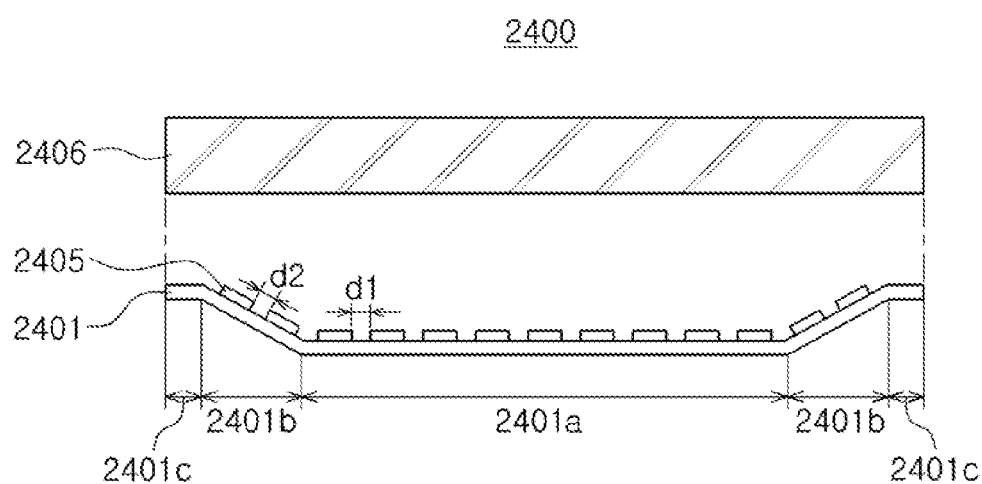
FIG. 17 is a cross-sectional view of a direct-type backlight unit employing a semiconductor light-emitting device package according to an example embodiment.

FIG. 17 is a cross-sectional view of a direct-type backlight unit 2400 employing a semiconductor light-emitting device package according to an example embodiment.

Referring to FIG. 17, a backlight unit 2400 may include light sources 2405 mounted on a circuit board 2401, and one or more optical sheets 2406 disposed above the light sources 2405.

The light sources 2405 may be white light-emitting apparatuses including a red phosphor according to example embodiments of the present inventive concept. A module in which the light sources 2405 are mounted on the circuit board 2401 may be the light source module illustrated in FIGS. 13 and 14.

The circuit board 2401 employed in the example embodiment of the present inventive concept may include a first planar portion 2401a corresponding to a main portion, an inclined portion 2401b, at least a part of which is angled, disposed around the first planar portion 2401a, and a second planar portion 2401c disposed in a corner of the circuit board 2401, that is, at an outside of the inclined portion 2401b. The light sources 2405 may be arranged at a first distance d1 on the first planar portion 2401a, and one or more light sources 2405 may also be arranged at a second distance d2 on the inclined portion 2401b. The first distance d1 may be the same as the second distance d2. A width of the inclined portion 2401b (or a length in a cross-sectional view) may be narrower than a width of the first planar portion 2401a, and greater than a width of the second planar portion 2401c. In addition, at least one light source 2405 may be arranged on the second planar portion 2401c, as needed.

An inclination of the inclined portion 2401b with respect to the first planar portion 2401a may be greater than 0° and lower than 90°. By having such a structure, the circuit board 2401 may maintain a uniform brightness even in the vicinity of an edge of the optical sheet 2406.

Figure 18:
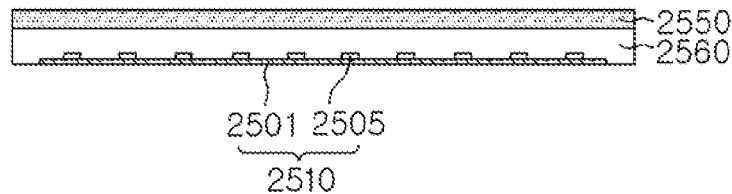
FIGS. 18, 19A, and 19B are cross-sectional views of backlight units employing a semiconductor light-emitting device package according to an example embodiment.
Figure 19A:
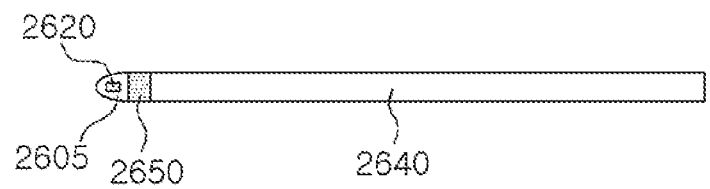
Figure 19B:
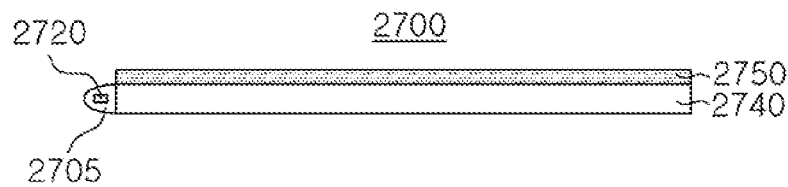

FIGS. 18, 19A, and 19B are cross-sectional views of backlight units employing a semiconductor light-emitting device package according to example embodiments.

As illustrated in FIGS. 18, 19A, and 19B, wavelength converters 2550, 2650, and 2750 may be arranged not in light sources 2505, 2605, and 2705 in backlight units 2500, 2600, and 2700, but at outsides of the light sources 2505, 2605, and 2705 in the backlight units 2500, 2600, and 2700 to convert light.

Referring to FIG. 18, the backlight unit 2500 may be a direct-type backlight unit, and may include the wavelength converter 2550, a light source module 2510 disposed below the wavelength converter 2550, and a bottom case 2560 accommodating the light source module 2510. In addition, the light source module 2510 may include a PCB 2501 and the plurality of light sources 2505 mounted on the PCB 2501.

In the backlight unit 2500 according to the example embodiment, the wavelength converter 2550 may be disposed on the bottom case 2560. Accordingly, a wavelength of at least a portion of light emitted from the light source module 2510 may be converted by the wavelength converter 2550. The wavelength converter 2550 may be applied by being fabricated in a separate film, or may be provided in a form integrated with a light diffuser (not illustrated in FIG. 18).

Referring to FIGS. 19A and 19B, the backlight units 2600 and 2700 may be edge-type backlight units, and may respectively include wavelength converters 2650 and 2750, light guide plates 2640 and 2740, reflectors 2620 and 2720, and light sources 2605 and 2705 disposed at one side of the light guide plates 2640 and 2740.

Light emitted from the light sources 2605 and 2705 may be guided into the light guide plates 2640 and 2740 by the reflectors 2620 and 2720. In the backlight unit 2600 in FIG. 19A, the wavelength converter 2650 may be disposed between the light guide plate 2640 and the light sources 2605. In the backlight unit 2700 of FIG. 19B, the wavelength converter 2750 may be disposed on a light-emitting surface of the light guide plate 2740.

The wavelength converters 2550, 2650, and 2750 of FIGS. 18, 19A, and 19B may include normal phosphor. In particular, when a QD phosphor is used to compensate for the characteristics of QD vulnerable to heat generated in the light sources or to moisture, the structures of wavelength converters 2550, 2650, and 2750 illustrated in FIGS. 18, 19A, and 19B may be utilized in the backlight units 2500, 2600, and 2700.

Figure 20:
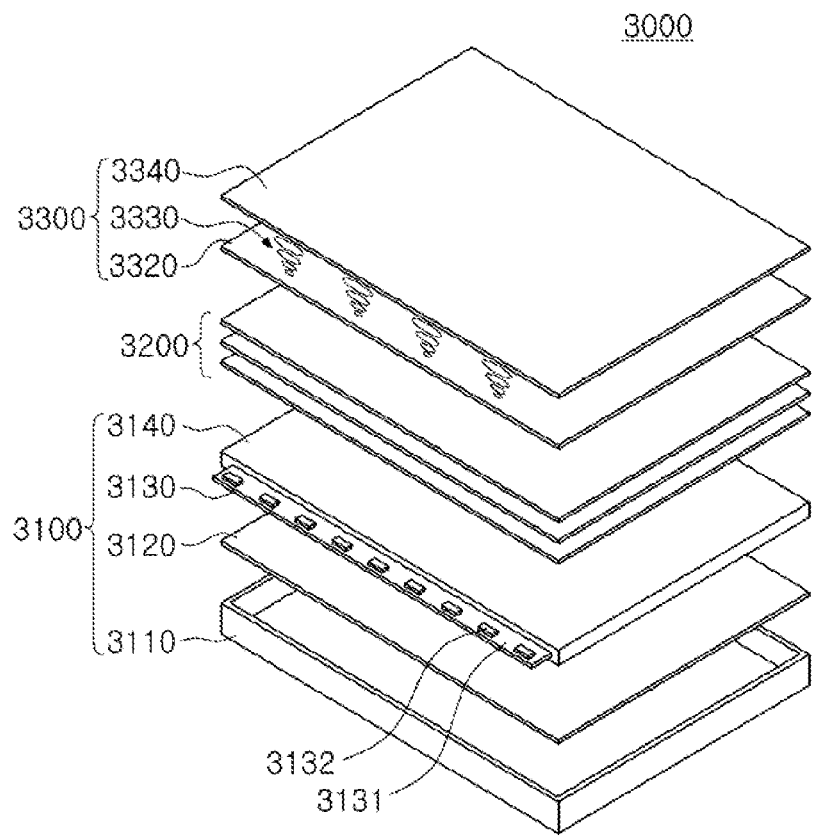
FIG. 20 is an exploded perspective view of a display apparatus employing a semiconductor light-emitting device package according to example embodiments of the present inventive concept.

FIG. 20 is an exploded perspective view of a display apparatus 3000 employing a semiconductor light-emitting device package according to an example embodiment.

Referring to FIG. 20, a display apparatus 3000 may include a backlight unit 3100, an optical sheet 3200, and an image display panel 3300 such as a liquid crystal panel.

The backlight unit 3100 may include a bottom case 3110, a reflector 3120, a light guide plate 3140, and a light source module 3130 disposed on at least one side of the light guide plate 3140. The light source module 3130 may include a PCB 3131 and light sources 3132. In particular, the light sources 3132 may be side-view type light-emitting devices mounted through a side adjacent to a light-emitting surface.

The optical sheet 3200 may be disposed between the light guide plate 3140 and the image display panel 3300, and may include various types of a sheet, such as a diffusion sheet, a prism sheet, or a protection sheet.

The image display panel 3300 may display an image using light emitted from the optical sheet 3200. The image display panel 3300 may include an array substrate 3320, a liquid crystal layer 3330, and a color filter substrate 3340. The array substrate 3320 may include pixel electrodes arranged in a matrix form, thin-film transistors to apply a driving voltage to the pixel electrodes, signal lines for operating the thin-film transistors, and the like. The color filter substrate 3340 may include a transparent substrate, a color filter, and a common electrode. The color filter may include filters selectively transmitting light having specific wavelengths in white light emitted from the backlight unit 3100. The liquid crystal layer 3330 may be rearranged by an electric field formed between the pixel electrodes and the common electrode to adjust light transmittance. The light having the adjusted light transmittance may pass through the color filter of the color filter substrate 3340 to display the image. The image display panel 3300 may further include a driving circuit unit processing an image signal.

In the display apparatus 3000 according to the example embodiment of the present inventive concept, since the light sources 3132 emitting blue light, green light, and red light which have relatively narrow FWHMs, a blue color, a green color, and a red color having high color purities may be implemented after the emitted light passes through the color filter substrate 3340.

Figure 21:
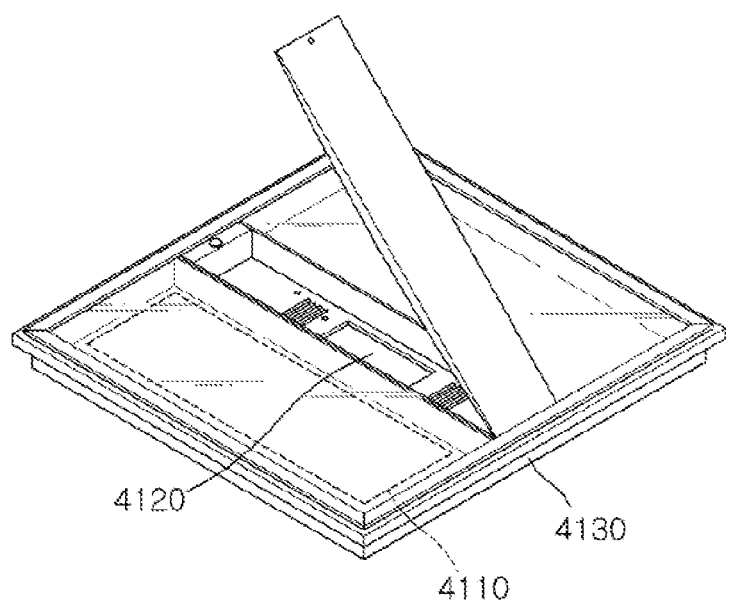
FIG. 21 is a perspective view of a flat panel lighting apparatus employing a semiconductor light-emitting device package according to an example embodiment.

FIG. 21 is a perspective view of a flat panel lighting apparatus 4100 employing a semiconductor light-emitting device package according to an example embodiment.

Referring to FIG. 21, a flat panel lighting apparatus 4100 may include a light source module 4110, a power supply 4120, and a housing 4130. According to the example embodiment of the present inventive concept, the light source module 4110 may include a light-emitting device array as a light source, and the power supply 4120 may include a light-emitting device driver.

The light source module 4110 may include the light-emitting device array, and have an overall planar shape. According to the example embodiment of the present inventive concept, the light-emitting device array may include a light-emitting device and a controller storing driving information of the light-emitting device.

The power supply 4120 may be configured to supply power to the light source module 4110. The housing 4130 may include an accommodating space to accommodate the light source module 4110 and the power supply 4120. In addition, the housing 4130 may be formed to have a hexahedral shape, one side of which is open, but is not limited thereto. The light source module 4110 may be disposed to emit light through the open side of the housing 4130.

FIG. 22 is an exploded perspective view of a lamp including a semiconductor light-emitting device package and a communications module according to an example embodiment.

Referring to FIG. 22, a lighting apparatus 4200 may include a socket 4210, a power supply 4220, a heat spreader 4230, a light source module 4240, and an optical unit 4250. According to the example embodiment of the present inventive concept, the light source module 4240 may include a light-emitting device array, and the power supply 4220 may include a light-emitting device driver.

The socket 4210 may be replaced by a normal lighting apparatus. The power supplied to the lighting apparatus 4200 may be applied through the socket 4210. As illustrated in FIG. 22, the power supply 4220 may be separated into a first power supply 4221 and a second power supply 4222. The heat spreader 4230 may include an internal heat spreader 4231 and an external heat spreader 4232. The internal heat spreader 4231 may be directly connected to the light source module 4240 and/or the power supply 4220, and thereby may serve to transmit heat to the external heat spreader 4232. The optical unit 4250 may include an internal optical unit (not shown) and an external optical unit (not shown), and may be configured to uniformly spread light emitted from the light source module 4240.

The light source module 4240 may receive power from the power supply 4220 to emit light to the optical unit 4250. The light source module 4240 may include one or more light-emitting devices 4241, a circuit board 4242, and a controller 4243. The controller 4243 may store driving information of the light-emitting devices 4241.

FIG. 23 is an exploded perspective view of a lamp including a semiconductor light-emitting device package and a communications module according to an example embodiment.

Referring to FIG. 23, different from the lighting apparatus 4200 illustrated in FIG. 22, a lighting apparatus 4300 according to the example embodiment may include a reflector 4310 on the light source module 4240. The reflector 4310 may function to uniformly spread light from light sources in lateral and rearward directions to reduce glare.

A communications module 4320 may be mounted on the reflector 4310, and home-network communications may be implemented through the communications module 4320. For example, the communications module 4320 may be a wireless communications module using Zigbee, Wi-Fi, or Li-Fi. The communications module 4320 may control functions, such as on/off or brightness adjustment of an interior or exterior light by using a smart phone or a wireless controller. In addition, the communications module 4320 may control electronics and car systems in and around the home, such as a TV, a refrigerator, an air conditioner, a door-lock, or an automobile, using a LiFi communications module using a visible light wavelength of the lighting apparatus installed in and around the home.

The reflector 4310 and the communications module 4320 may be covered by a cover 4330.

Figure 24:
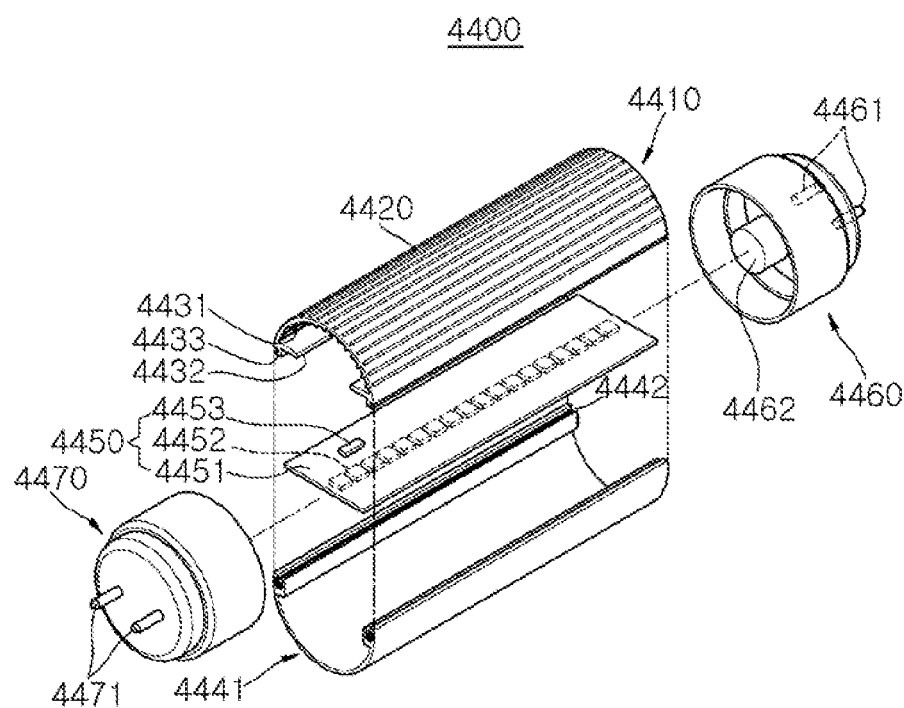
FIG. 24 is an exploded perspective view of a bar-type lamp employing a semiconductor light-emitting device package according to an example embodiment.

FIG. 24 is an exploded perspective view of a bar-type lamp employing a semiconductor light-emitting device package according to an example embodiment.

Referring to FIG. 24, a lighting apparatus 4400 may include a heat-dissipating member 4410, a cover 4441, a light source module 4450, a first socket 4460, and a second socket 4470. A plurality of heat-dissipating fins 4420 and 4431 may be disposed on an inner surface and/or an outer surface of the heat-dissipating member 4410 in the form of ridges, and the heat-dissipating fins 4420 and 4431 may be designed to have a variety of shapes and distances therebetween. An overhang-type support 4432 may be formed at an inner side of the heat-dissipating member 4410. The light source module 4450 may be fastened on the support 4432. A fastening protrusion 4433 may be formed at each end portion of the heat-dissipating member 4410.

A fastening groove 4442 may be formed in the cover 4441, and the fastening protrusion 4433 of the heat-dissipating member 4410 may be combined with the fastening groove 4442 in a hook-coupling structure. Positions of the fastening groove 4442 and the fastening protrusion 4433 may be exchanged.

The light source module 4450 may include a light-emitting device array. The light source module 4450 may include a PCB 4451, a light source 4452, and a controller 4453. As described above, the controller 4453 may store driving information of the light source 4452. Circuit interconnections for operating the light source 4452 may be formed on the PCB 4451. In addition, the PCB 4451 may further include other components for operating the light source 4452.

The first and second sockets 4460 and 4470 may be a pair of sockets, and may have a structure combined with both end portions of a cylindrical cover unit formed of the heat-dissipating member 4410 and the cover 4441. For example, the first socket 4460 may include an electrode terminal 4461 and a power device 4462, and the second socket 4470 may include a dummy terminal 4471. In addition, an optical sensor and/or a communications module may be embedded in one of the first socket 4460 and the second socket 4470. For example, the optical sensor and/or the communications module may be embedded in the second socket 4470 including the dummy terminal 4471. As another example, the optical sensor and/or the communications module may be embedded in the first socket 4460 including the electrode terminal 4461.

According to the example embodiment, an internet of things (IoT) apparatus may be equipped with an accessible wired or wireless interface, and may include apparatuses transmitting or receiving data by communicating with one or more other apparatuses through the wired or wireless interface. The accessible interface may include a modem communications interface accessible to a wired local area network (LAN), a wireless local area network (WLAN) such as a wireless fidelity (Wi-Fi), a wireless personal area network (WPAN) such as Bluetooth, a wireless universal serial bus (USB), Zigbee, near field communication (NFC), radio-frequency identification (RFID), power line communication (PLC), or a mobile cellular network, such as a 3rd Generation (3G) network, a 4th Generation (4G) network, or a Long Term Evolution (LTE) network. The Bluetooth interface may support Bluetooth Low Energy (BLE).

Figure 25:
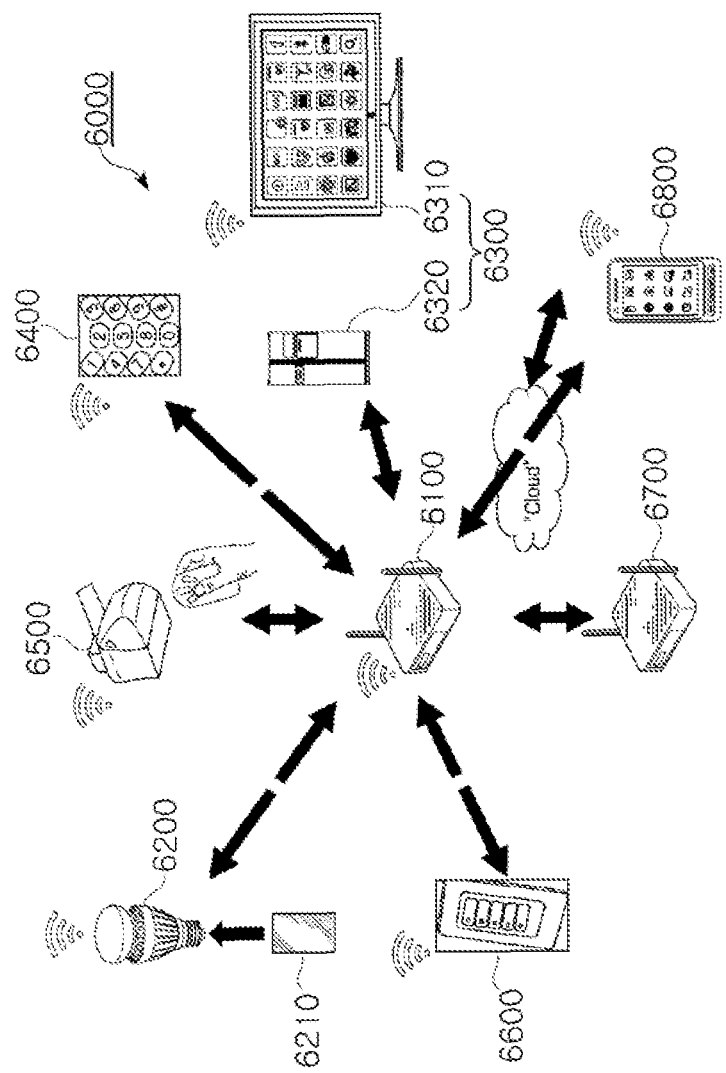
FIG. 25 is an indoor lighting control network system employing a semiconductor light-emitting device package according to an example embodiment.

FIG. 25 is an indoor lighting control network system 6000 employing a semiconductor light-emitting device package according to an example embodiment.

A network system 6000 according to the example embodiment may be a complex smart light-network system in which lighting technology using a light-emitting device such as an LED is mixed with IoT technology, wireless communications technology, or the like. The network system 6000 may be implemented using a variety of lighting apparatuses and wired/wireless communications apparatuses. The network system 6000 may be implemented by a sensor, a controller, a communications device, software for network control and maintenance, or the like.

The network system 6000 may be utilized in an open area, such as a park or a street, as well as in a closed space defined within a building, such as home or office. The network system 6000 may be implemented based on an IoT environment so as to collect/process a variety of information and provide the information to a user. Here, an LED lamp 6200 included in the network system 6000 may function to not only control the illumination of itself by receiving information about a surrounding environment from a gateway 6100, but also check and control operations of other apparatuses 6300 to 6800 belonging to the IoT environment based on, for example, a visible light communication function of the LED lamp 6200.

Referring to FIG. 25, the network system 6000 may include the gateway 6100 processing data transmitted and received according to different communication protocols, the LED lamp 6200 connected to the gateway 6100 to enable communication and including an light-emitting device, and the plurality of apparatuses 6300 to 6800 connected to the gateway 6100 to enable communication according to a variety of wireless communication systems. In order to implement the network system 6000 based on the IoT environment, the LED lamp 6200 and each of the apparatuses 6300 to 6800 may include at least one communications module. In some example embodiments, the LED lamp 6200 may be connected to the gateway 6100 by a wireless communication protocol, such as Wi-Fi, Zigbee, or Li-Fi, to enable communications. In this regard, the LED lamp 6200 may include at least one lamp communications module 6210.

As described above, the network system 6000 may be utilized in an open area, such as a park or a street, as well as in a closed space defined within a building, such as home or office. When the network system 6000 is utilized at home, the plurality of apparatuses 6300 to 6800 belonging to the network system 6000 and connected to the gateway 6100 to enable communications, based on the IoT technology, may include a household appliance 6300, a digital door lock 6400, a garage door lock 6500, a wall-mounted lighting switch 6600, a router 6700 for wireless network relay 6700, or a mobile apparatus 6800, such as a smart phone, a tablet, or a laptop computer.

In the network system 6000, the LED lamp 6200 may check an operating state of the variety of apparatuses 6300 to 6800 by using a wireless communications network (e.g. Wi-Fi, Zigbee, or Li-Fi) installed in home, or may automatically control the intensity of the LED lamp 6200 according to surrounding environment/conditions. In addition, the LED lamp 6200 may control the apparatuses 6300 to 6800 belonging to the network system 6000 by using Li-Fi (LED Wi-Fi) communications using visible light emitted from the LED lamp 6200.

First, the LED lamp 6200 may automatically control the intensity thereof on the basis of information about the surrounding environment transferred from the gateway 6100 through the lamp communications module 6210 or collected from the sensor installed in the LED lamp 6200. For example, the intensity of the LED lamp 6200 may be automatically controlled according to the type of a program being broadcast on a television 6310 or a brightness of a screen. For this, the LED lamp 6200 may receive operating information of the television 6310 from the lamp communications module 6210 connected to the gateway 6100. The lamp communications module 6210 may be integrated and modularized with the sensor and/or controller included in the LED lamp 6200.

For example, when a program being broadcasted on the television 6310 is a drama, a color temperature of the LED lamp 6200 may be lowered to 12,000 K or less (e.g. 6,000 K) according to a preset value and color tones of the LED lamp 6200 may be adjusted to produce a cozy atmosphere. On the contrary, when the program is a comedy, the network system 6000 may be configured to increase the color temperature of the LED lamp 6200 may increase to 6,000 K or more according to a preset value and adjust the LED lamp 6200 to emit blue-based white light.

In addition, when a period of time has elapsed after the digital door lock 6400 was locked in the absence of person at home, all of lighted LED lamps 6200 may be turned off to prevent power wastage. In addition, when the digital door lock 6400 is locked in the absence of person at home after a security mode is set through the mobile apparatus 6800, the LED lamp 6200 may be maintained at a turn-on state.

The operation of the LED lamp 6200 may be controlled according to the surrounding environment collected through various sensors connected to the network system 6000. For example, when the network system 6000 is implemented in a building, a light, a location sensor, and a communications module may be combined in the building, the light may be turned-on or turned-off by collecting information about locations of people in the building, or the collected information may be provided in real time to enable facility management or efficient use of idle spaces. Normally, lighting apparatuses such as the LED lamp 6200 may be placed in every space at each floor in a building, a variety of information may be collected through the sensor provided integrally with the LED lamp 6200, and the collected information may be utilized in the facility management or the use of idle spaces.

Meanwhile, the LED lamp 6200 may be combined with an image sensor, a storage apparatus, the lamp communications module 6210, or the like to be utilized as an apparatus to maintain building security or detect an emergency and respond thereto. For example, when a smoke or temperature sensor is attached to the LED lamp 6200, an outbreak of fire may be quickly detected to minimize damages. Further, the brightness of the lightings may be controlled in consideration of external weather or sunlight to save energy and provide a comfortable lighting environment.

Figure 26:
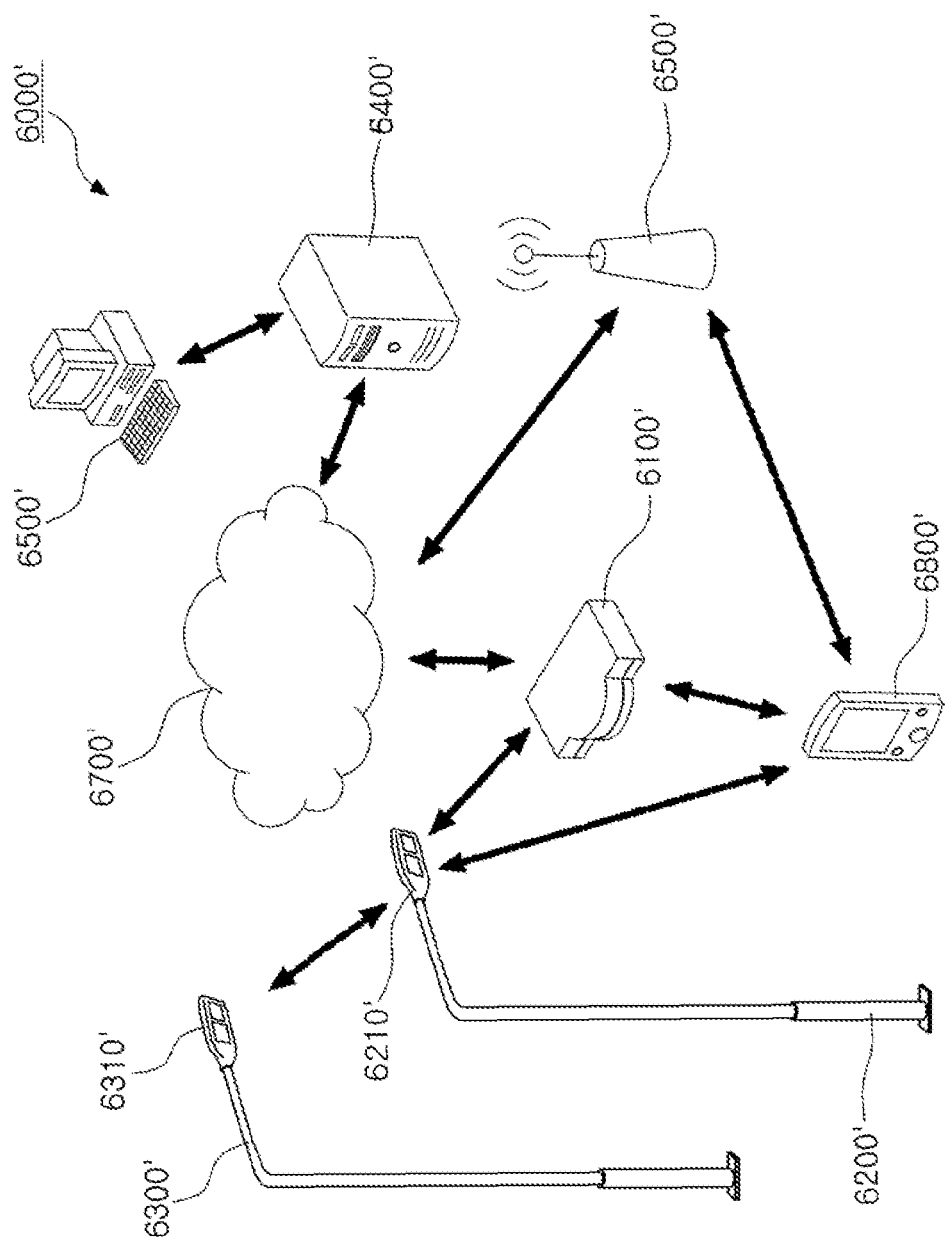
FIG. 26 illustrates an open network system employing a semiconductor light-emitting device package according to an example embodiment.

FIG. 26 illustrates an open network system 6000' employing a semiconductor light-emitting device package according to an example embodiment.

Referring to FIG. 26, a network system 6000' according to the example embodiment may include a communications connection apparatus 6100', a plurality of lighting apparatuses 6200' and 6300' installed at a predetermined interval to communicate with the communications connection apparatus 6100', a server 6400', a computer 6500' for managing the server 6400', a communication base station 6600', a communications network 6700' connecting the above-described communicable apparatuses, and a mobile apparatus 6800'.

The plurality of lighting apparatuses 6200' and 6300' installed in an outside open space, such as a street or a park, may include smart engines 6210' and 6310', respectively. Each of the smart engines 6210' and 6310' may include a sensor for collecting environmental information and communications module, in addition to a light-emitting device emitting light and a driver driving the light-emitting device. The smart engines 6210' and 6310' may communicate with other nearby apparatuses according to a communication protocol, such as Wi-Fi, Zigbee, Li-Fi, using the communications module.

For example, one smart engine 6210' may be connected to the other smart engine 6310' to enable communication. Here, for a mutual communication between the smart engines 6210' and 6310', Wi-Fi extension technology (Wi-Fi Mesh) may be applied. At least one smart engine 6210' may be connected to the communications connection apparatus 6100' connected to the communications network 6700'. In order to increase communication efficiency, the plurality of smart engines 6210' and 6310' may be combined in one group and connected to one communications connection apparatus 6100'.

The communications connection apparatus 6100' may be an access point (AP) enabling wired/wireless communication, and mediate communication between communications network 6700' and another apparatus. The communications connection apparatus 6100' may be connected to the communications network 6700'. For example, the communications connection apparatus 6100' may be mechanically accommodated inside one of the lighting apparatuses 6200' and 6300'.

The communications connection apparatus 6100' may be connected to the mobile apparatus 6800' through a communication protocol such as Wi-Fi. A user of the mobile apparatus 6800' may receive the environmental information collected by the plurality of smart engines 6210' and 6310' using the communications connection apparatus 6100' connected by the smart engine 6210' of the lighting apparatus 6200'. The environmental information may include nearby traffic information, weather information, or the like. The mobile apparatus 6800' may be connected to the communications network 6700' via the communication base station 6600', using a wireless cellular communication system such as 3G or 4G.

Meanwhile, the server 6400' connected to the communications network 6700' may receive information collected by the smart engines 6210' and 6310' respectively installed in the lighting apparatuses 6200' and 6300' and monitor an operating state of each of the lighting apparatuses 6200' and 6300', at the same time. In order to manage each of lighting apparatuses 6200' and 6300' based on the result of monitoring of the operating state of each of the lighting apparatuses 6200' and 6300', the server 6400' may be connected to the computer 6500' providing a management system. The computer 6500' may execute software monitoring and managing the operating state of each lighting apparatuses 6200' and 6300' and, in particular, each of the smart engines 6210' and 6310'.

Figure 27:
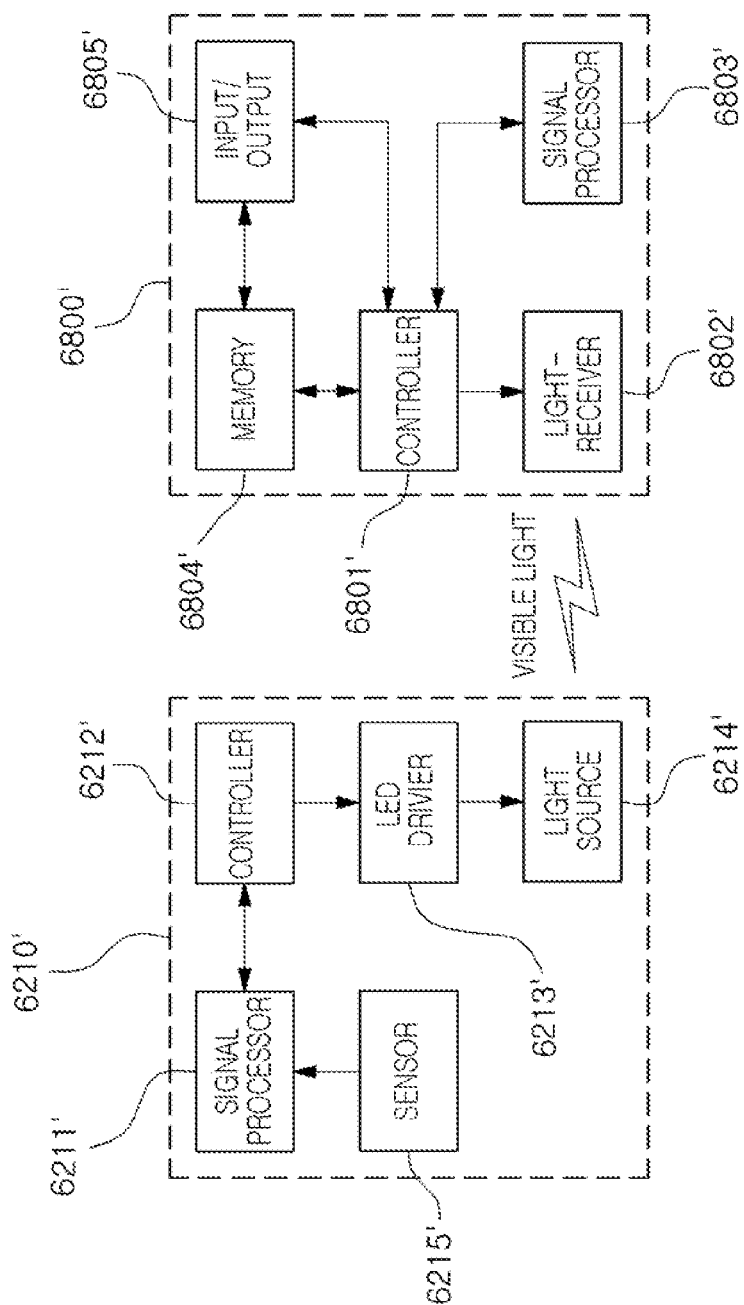
FIG. 27 is a block diagram illustrating communications between a smart engine of a lighting apparatus employing a semiconductor light-emitting device package according to an example embodiment and a mobile apparatus, using visible light wireless communications.

FIG. 27 is a block diagram illustrating communications between a smart engine 6210' of a lighting apparatus employing a semiconductor light-emitting device package according to example embodiment and a mobile apparatus, using visible light wireless communications.

Referring to FIG. 27, the smart engine 6210' may include a signal processor 6211', a controller 6212', an LED driver 6213', a light source 6214', and a sensor 6215'. The mobile apparatus 6800' connected to the smart engine 6210' by the visible light wireless communications may include a controller 6801', a light-receiver 6802', a signal processor 6803', a memory 6804', and an input/output 6805'.

The visible light wireless communications (Li-Fi) technology may be a wireless communications technology in which information is wirelessly transferred using light of a visible wavelength band that can be recognized by the human eye. Such visible light wireless communications technology may be different from an existing wired optical communications technology and infrared wireless communications technology because it uses light of a visible light wavelength band, that is, a specific visible light frequency emitted by the above-described light-emitting device package, and may be different from the wired optical communications technology because it is operated in a wireless communication environment. In addition, the visible light wireless communications technology may be convenient since it is freely available without restrictions or authorization in terms of frequency use, unlike RF wireless communications, has excellent physical security, and has distinction in that a user can see communications links. Most of all, the visible light wireless communications technology is characterized as fusion technology through which an original purpose as a light source and a communication function are achieved at the same time.

The signal processor 6211' of the smart engine 6210' may process data to be transmitted/received using the visible light wireless communications technology. In some example embodiments, the signal processor 6211' may process information collected by the sensor 6215' into data to be transmitted to the controller 6212'. The controller 6212' may control operations of the signal processor 6211' and the LED driver 6213' and, in particular, operations of the LED driver 6213' based on the data transmitted by the signal processor 6211'. The LED driver 6213' may serve the light source 6214' to emit light according to a control signal transmitted by the controller 6212', and transmit data to the mobile apparatus 6800'.

The mobile apparatus 6800' may include a controller 6801', a memory 6804' to store data, an input/output 6805' including a display, a touch screen, and an audio output, a signal processor 6803', and a light-receiver 6802' to recognize visible light having data. The light-receiver 6802' may detect visible light and convert it into an electric signal, and the signal processor 6803' may decode data included in the electric signal converted by the light-receiver 6802'. The controller 6801' may store the data decoded by the signal processor 6803' in the memory 6804', or output the data through the input/output 6805' so that a user can recognize the data.

As set forth above, according to the example embodiments of the present inventive concept, a failure of a semiconductor light-emitting device package due to the difference in physical properties between a semiconductor layer and the other structures of the semiconductor light-emitting device package may be suppressed.

While example embodiments have been particularly shown and described above, it will be apparent to those skilled in the art that modifications and variations could be made without departing from the scope of the inventive concept as defined by the following claims.

What is claimed is:

1. A semiconductor light-emitting device package, comprising:
a light-emitting structure having a first surface, a second surface opposite to the first surface and side surfaces disposed between the first surface and the second surface, the light-emitting structure comprising a first light-emitting laminate and a second light-emitting laminate, each of the first light-emitting laminate and the second light-emitting laminate comprising:
a first conductivity-type semiconductor layer;
an active layer, and
a second conductivity-type semiconductor layer, the first conductivity-type semiconductor layer, the active layer and the second conductivity-type semiconductor layer being sequentially stacked in a direction from the first surface to the second surface,
an interconnector provided on the second surface of the light-emitting structure and configured to electrically connect the first light-emitting laminate and the second light-emitting laminate;
a metal guide surrounding the side surfaces of the light-emitting structure; and
an encapsulant surrounding the metal guide and the second and the side surfaces of the light-emitting structure and exposing the first surface of the light-emitting structure,
wherein the interconnector and the metal guide are disposed with substantially a same thickness, in a thickness direction of the first light-emitting laminate and the second light-emitting laminate.

2. The semiconductor light-emitting device package of claim 1, wherein the encapsulant is provided between the metal guide and the light-emitting structure.

3. The semiconductor light-emitting device package of claim 1, wherein the encapsulant is provided between the interconnector and the metal guide.

4. The semiconductor light-emitting device package of claim 1, wherein at least a portion of the interconnector is connected to the metal guide.

5. The semiconductor light-emitting device package of claim 1, wherein the first light-emitting laminate and the second light-emitting laminate are arranged in a first direction, and
wherein the interconnector extends from a first side to a second side opposite to the first side of the metal guide between adjacent light-emitting laminates in a second direction substantially perpendicular to the first direction.

6. The semiconductor light-emitting device package of claim 1, wherein each of the first light-emitting laminate and the second light-emitting laminate further comprises:
a first electrode structure connected to the first conductivity-type semiconductor layer; and
a second electrode structure connected to the second conductivity-type semiconductor layer.

7. The semiconductor light-emitting device package claim 6, wherein the first electrode structure comprises:
a first contact disposed in a contact hole passing through the second conductivity-type semiconductor layer and the active layer and exposing a portion of the first conductivity-type semiconductor layer while being in contact with the first conductivity-type semiconductor layer; and
a first connector connected to the first contact, and
wherein the second electrode structure comprises:

a second contact in contact with the second conductivity-type semiconductor layer; and
a second connector connected to the second contact.

8. The semiconductor light-emitting device package of claim 6, wherein:
a first pad is provided on the first electrode structure of the first light-emitting laminate;
a second pad is provided on the second electrode structure of the second light-emitting laminate; and
first and second metal posts are connected to the first pad and the second pad, respectively, the first and second metal posts having portions exposed from the encapsulant so as to be connected to an external power source.

9. The semiconductor light-emitting device package of claim 8, wherein the metal guide is connected to at least one of the first pad and the second pad.

10. The semiconductor light-emitting device package of claim 1, wherein the interconnector connects the first conductivity-type semiconductor layer of the first light-emitting laminate to the second conductivity-type semiconductor layer of the second light-emitting laminate.

11. The semiconductor light-emitting device package of claim 1, wherein the interconnector and the metal guide are formed of a same material.

12. The semiconductor light-emitting device package of claim 1, wherein a first coefficient of thermal expansion of the metal guide is greater than a second coefficient of thermal expansion of the first light-emitting laminate and the second light-emitting laminate, and lower than a third coefficient of thermal expansion of the encapsulant.

13. The semiconductor light-emitting device package of claim 1, further comprising a transparent resin layer containing phosphor on the first light-emitting laminate and the second light-emitting laminate.

14. The semiconductor light-emitting device package of claim 1, wherein the first conductivity-type semiconductor layer comprises embossings formed on an upper surface thereof.

15. A semiconductor light-emitting device package, comprising:
a light-emitting structure having a first surface which is a light-emitting surface, a second surface opposite to the first surface and side surfaces disposed between the first surface and the second surface, the light-emitting structure comprising a first light-emitting laminate and a second light-emitting laminate, each of the first light-emitting laminate and the second light-emitting laminate comprising:
a first conductivity-type semiconductor layer;
an active layer, and
a second conductivity-type semiconductor layer, the first conductivity-type semiconductor layer, the active layer and the second conductivity-type semiconductor layer being sequentially stacked in a direction from the first surface to the second surface,
an interconnector provided on the second surface of the light-emitting structure and configured to electrically connect the first light-emitting laminate and the second light-emitting laminate;
a metal guide surrounding the side surfaces of the light-emitting structure; and
an encapsulant surrounding the metal guide and the second and the side surfaces of the light-emitting structure and exposing the first surface of the light-emitting structure, wherein an upper surface of the metal guide is disposed at a height equal to or lower than the first surface of the light-emitting structure, and wherein the interconnector and the metal guide are disposed with substantially a same thickness, in a thickness direction of the first light-emitting laminate and the second light-emitting laminate.

16. A semiconductor light-emitting device package, comprising:

a light-emitting structure having a first surface, a second surface opposite to the first surface and side surfaces disposed between the first surface and the second surface, the light-emitting structure comprising at least one light-emitting laminate, the at least one light-emitting laminate comprising:

a first conductivity-type semiconductor layer;

an active layer; and a second conductivity-type semiconductor layer, the first conductivity-type semiconductor layer, the active layer and the second conductivity-type semiconductor layer being sequentially stacked in a direction from the first surface to the second surface;

a first electrode structure formed on the second surface of the light-emitting structure, disposed in a contact hole passing through the second conductivity-type semiconductor layer and the active layer to expose a portion of the first conductivity-type semiconductor layer, the first electrode structure being in contact with the first conductivity-type semiconductor layer;

a second electrode structure disposed on the second conductivity-type semiconductor layer;

an interconnector provided on the second surface of the light-emitting structure;

a metal guide spaced apart from the light-emitting structure and surrounding the side surfaces of the light-emitting structure;

an encapsulant encapsulating the metal guide, surrounding the second surface and the side surfaces of the light-emitting structure, and exposing the first surface of the light-emitting structure; and a first metal post and a second metal post being connected to the first electrode structure and the second electrode structure of the light-emitting structure, respectively, and having portions exposed from the encapsulant so as to be electrically connected to an external power source, wherein the interconnector and the metal guide are disposed with substantially a same thickness, in a thickness direction of the at least one light-emitting laminate.

* * * * *